(12) United States Patent
Shigihara et al.

(10) Patent No.: US 8,592,984 B2
(45) Date of Patent: Nov. 26, 2013

(54) SEMICONDUCTOR INTEGRATED CIRCUIT DEVICE AND METHOD OF MANUFACTURING THE SAME

(75) Inventors: Hiromi Shigihara, Kanagawa (JP); Akira Yajima, Kanagawa (JP); Hisao Shigihara, Kanagawa (JP); Hiroshi Tsukamoto, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 58 days.

(21) Appl. No.: 13/160,497

(22) Filed: Jun. 14, 2011

(65) Prior Publication Data

US 2011/0304049 A1 Dec. 15, 2011

(30) Foreign Application Priority Data

Jun. 15, 2010 (JP) .................. 2010-136029

(51) Int. Cl.
*H01L 23/48* (2006.01)
(52) U.S. Cl.
USPC ............. 257/762; 257/782; 257/E23.01
(58) Field of Classification Search
USPC .................. 257/762, 782, E23.01
See application file for complete search history.

(56) References Cited

U.S. PATENT DOCUMENTS

| 6,861,344 | B2* | 3/2005 | Yajima et al. ............. 438/612 |
| 7,855,452 | B2* | 12/2010 | Yanase et al. ............. 257/737 |
| 8,153,186 | B2* | 4/2012 | Nagamatsu et al. ......... 427/97.3 |
| 8,227,341 | B2* | 7/2012 | Onai et al. ................. 438/652 |
| 2005/0006760 | A1* | 1/2005 | Terui ....................... 257/734 |
| 2008/0136033 | A1* | 6/2008 | Nagamatsu et al. ......... 257/758 |
| 2009/0073667 | A1* | 3/2009 | Chung et al. .............. 361/763 |
| 2009/0184411 | A1* | 7/2009 | Chung et al. .............. 257/691 |
| 2010/0164105 | A1* | 7/2010 | Onai et al. ................. 257/751 |
| 2011/0074025 | A1* | 3/2011 | Yanase et al. ............. 257/737 |

FOREIGN PATENT DOCUMENTS

JP 2003-234348 A 8/2003

\* cited by examiner

*Primary Examiner* — Lex Malsawma
(74) *Attorney, Agent, or Firm* — Miles & Stockbridge P.C.

(57) ABSTRACT

To suppress peeling of an Au pad for external coupling provided in a rewiring containing Cu as a main component. On the surface of a rewiring including a two-layer film in which a first Ni film is laminated on the top of a Cu film, a pad to which a wire is coupled is formed. The pad includes a two-layer film in which an Au film is laminated on the top of a second Ni film and formed integrally so as to cover the top surface and the side surface of the rewiring. Due to this, the area of contact between the rewiring and the pad increases, and therefore, the pad becomes difficult to be peeled off from the rewiring.

4 Claims, 31 Drawing Sheets

SEMICONDUCTOR INTEGRATED CIRCUIT DEVICE AND METHOD OF MANUFACTURING THE SAME

CROSS-REFERENCE TO RELATED APPLICATIONS

The disclosure of Japanese Patent Application No. 2010-136029 filed on Jun. 15, 2010 including the specification, drawings and abstract is incorporated herein by reference in its entirety.

BACKGROUND

The present invention relates to a semiconductor integrated circuit device and a method of manufacturing the same and, more particularly, to technology effective when applied to a semiconductor integrated circuit device having a rewiring including a metal film on the top of a plurality of wiring layers formed over a main surface of a semiconductor substrate and a method of manufacturing the same.

In a, semiconductor integrated circuit device, on the top of a semiconductor substrate on which a semiconductor element, for example, a CMIS (Complementary Metal Insulator Semiconductor) transistor, is formed, a multilayer wiring is formed by a metal film containing, for example, a Cu (copper) or Al (aluminum) alloy as a main component, and a final passivation film is formed on the top of the multilayer wiring.

Here, as disclosed in, for example, Patent Document 1 (Japanese Patent Laid-Open No. 2003-234348), the technology to form a rewiring containing Cu as a main component on a final passivation film and to electrically couple an electrode pad formed in the uppermost wiring layer under the final passivation film and the rewiring is known.

SUMMARY

The inventors of the present invention have been engaging in research and development for improvement of the characteristics of a semiconductor integrated circuit device (semiconductor device) having a rewiring and have found the following new technical problems not known publicly.

In a semiconductor integrated circuit device having a rewiring, in general, a structure is adopted in which, for example, an electrode pad and a solder bump (bump electrode) as an external coupling terminal are coupled at one end of a rewiring, and an increase in the degree of freedom in wiring design is demanded accompanying the miniaturization, enhancement in functions, etc.

Further, there is a need for external coupling by wire bonding also in a semiconductor integrated circuit device having a rewiring. Hence, there can be conceived of technology to bond a wire onto a rewiring. It is demanded to improve the technology to bond a wire onto a pad (Au pad) by forming the pad including a Au (gold) film by the electroless plating method, for example, on the top surface of a rewiring.

On the other hand, for an IC package for sealing a semiconductor chip, it is demanded to improve the technology to thin a semiconductor chip by grinding, with a grinder, the back surface of a semiconductor wafer that has been subjected to the preceding process (wafer process), accompanying the thinning of a package.

In the step of grinding the back surface of a semiconductor wafer, a protection tape called a back grind tape is pasted to a device surface of the semiconductor wafer to prevent the device surface from being stained or damaged. However, the inventors of the present invention have found a phenomenon in which part of a Au plated film, which is a pad, is peeled off from the top surface of a rewiring when peeling off a back grind tape from the device surface of the semiconductor wafer having been subjected to the back surface grinding in the case of a semiconductor integrated circuit device as described above in which the Au plated film, which is a pad for bonding, is provided on the top surface of the rewiring. Further, the inventors of the present invention have also found a phenomenon in which, for example, the pad at the peeled-off portion bends and overlaps the pad part not peeled off yet.

In recent years, in a high withstand voltage transistor or transistor for high voltage, such as a power MIS transistor that operates at as high a voltage as, for example, tens of V, arise in the ON resistance resulting from the electrical resistance of a wire that couples the transistor and an external coupling terminal becomes a serious problem. If the wire length from the transistor to the external coupling terminal is reduced in order to address the problem, it is necessary to increase the number of the external coupling terminals, and therefore, there arises such a problem that the wiring design becomes complicated.

The present invention has been made in view of the above circumstances and provides technology capable of suppressing a pad from being peeled off in a semiconductor integrated circuit device in which a pad for wire bonding is formed on the top surface of a rewiring.

The present invention has also been made in view of the above circumstances and provides technology capable of increasing the degree of freedom in wiring design in a semiconductor integrated circuit device having a rewiring.

The other purposes and the new feature of the present invention will become clear from the description of the present specification and the accompanying drawings.

The following explains briefly the embodiment of a typical invention among the inventions disclosed in the present application.

(1) A semiconductor integrated circuit device, an embodiment of the present invention, includes the following: (a) a semiconductor substrate having a device surface, (b) a plurality of semiconductor elements formed on the device surface and a plurality of wiring layers coupling the semiconductor elements, (c) a protection film covering the top of the device surface, (d) a first pad including part of the uppermost wiring layer of the wiring layers and exposed from a pad opening formed in the protection film, (e) a rewiring formed on the top of the protection film and electrically coupled to the first pad through the pad opening, and (f) a second pad formed integrally so as to cover at least part of the top surface of the rewiring and at least part of the side surface of the rewiring.

(2) A method of manufacturing a semiconductor integrated circuit device, an embodiment of the present invention, includes the following steps of: (a) coating, with a protection film, the top of a device surface of a semiconductor wafer on which a plurality of semiconductor elements and a plurality of wiring layers coupling the semiconductor elements are formed, (b) forming a first pad by etching the protection film to form a pad opening and exposing part of the uppermost wiring layer of the wiring layers from the pad opening, (c) forming a metal seed film over the device surface including the top surface of the first pad, (d) forming a first photoresist film pattern having a first opening inside which the first pad is included over the metal seed film, (e) forming a rewiring by electroplating on the top surface of the metal seed film inside the first opening, (f) forming a second photoresist film pattern having a second opening inside which at least part of the top surface of the rewiring and at least part of the side surface of the rewiring are included over the device surface, (g) integrally forming a second pad by electroplating on the top surface and side surface of the rewiring inside the second opening, (h) after the step (g), removing the first and second photoresist film patterns, and (i) after the step (h), removing the metal seed film in a region covered with the first photoresist film pattern.

(3) A semiconductor integrated circuit device, an embodiment of the present invention, includes the following: a first rewiring constituting an external coupling terminal of the semiconductor integrated circuit device and a second rewiring not constituting the external coupling terminal and electrically coupling wirings. The first rewiring is provided with a second pad but the second rewiring is not provided with the second pad.

(4) A semiconductor integrated circuit device, an embodiment of the present invention, includes the following: an A rewiring having a first line width and a B rewiring having a second line width greater than the first line width. The B rewiring is electrically coupled to an external coupling terminal of the semiconductor integrated circuit device. The B rewiring is electrically coupled to a plurality of first pads through a plurality of pad openings. The number of the pad openings is larger than that of the external coupling terminals coupled to the B rewiring.

(5) A semiconductor integrated circuit device, an embodiment of the present invention, has a first pad or a first wiring exposed from a pad opening formed in a surface protection film and a third rewiring formed on the top of the surface protection film and electrically coupled to the first pad or the first wire through the pad opening. The number of the first wiring or the first pad electrically coupled to the third rewiring is configured so as to be greater than the number of wires (external coupling terminals) electrically coupled to the third rewiring.

(6) A semiconductor integrated circuit device, an embodiment of the present invention, has a first pad or a second wiring exposed from a pad opening formed in a surface protection film and a fourth rewiring formed on the top of the surface protection film and electrically coupled to the first pad or the second wiring through the pad opening. The number of pad openings formed in the second wiring is configured so as to be greater than the number of bonding wires (external coupling terminals) electrically coupled to the fourth rewiring.

(7) A semiconductor integrated circuit device, an embodiment of the present invention, has a first pad or a third wiring exposed from a pad opening formed in a surface protection film and a fifth and a sixth rewiring formed on the top of the surface protection film and electrically coupled to the first pad or the third wiring through the pad opening. The line width of the first pad or the fifth rewiring is configured so as to be greater than that of the first pad or the sixth rewiring. The number of the pad openings electrically coupling the fifth rewiring and the first pad or the third wiring is configured so as to be greater than that of the pad openings coupling the sixth rewiring and the first pad or the third wiring.

(8) A semiconductor integrated circuit device, an embodiment of the present invention, has a first pad or a third wiring exposed from a pad opening formed in a surface protection film and a fifth and a sixth rewiring formed on the top of the surface protection film and electrically coupled to the first pad or the third wiring through the pad opening. The line width of the first pad or the fifth rewiring is configured so as to be greater than that of the first pad or the sixth rewiring. The number of the first pads or the third wirings electrically coupled to the fifth rewiring is configured so as to be greater than that of the first pads or the third wirings electrically coupled to the sixth rewiring.

(9) A semiconductor integrated circuit device, an embodiment of the present invention, has a first pad or a fourth wiring exposed from a pad opening formed in a surface protection film and a fifth rewiring formed on the top of the surface protection film and electrically coupled to the first pad or the fourth wiring through the pad opening. The fifth rewiring is configured to dissipate heat.

The following explains briefly the effect acquired by the typical embodiment among the embodiments disclosed in the present application.

In a semiconductor integrated circuit device in which a pad for wire bonding is formed on the top surface of a rewiring, it is possible to suppress such a trouble that a pad is peeled off from the top surface of the rewiring.

Further, in a semiconductor integrated circuit device having a rewiring, it is possible to increase the degree of freedom in wiring design.

DETAILED DESCRIPTION

Figure 1:
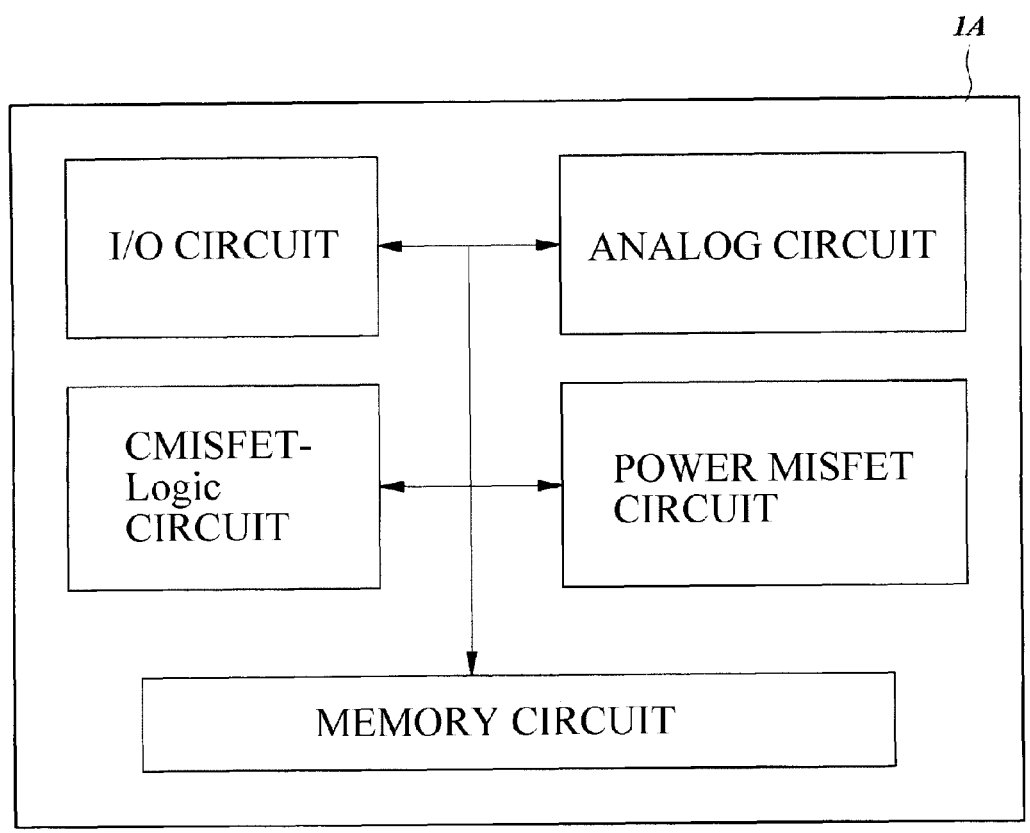
FIG. 1 is a circuit block diagram of a semiconductor integrated circuit device, an embodiment of the present invention.

Hereinafter, embodiments of the present invention are explained in detail based on the drawings. In all the drawings for explaining embodiments, the same symbol is attached to a member having the same function and the repeated explanation thereof is omitted. In embodiments, the explanation of the same or similar part is not repeated, as a principle, except when it is necessary in particular. Further, in the drawings for explaining embodiments, in order to make a drawing intelligible, hatching may be attached even if it is a plan view or hatching is omitted even if it is a section view.

A semiconductor integrated circuit device (semiconductor device) in the present embodiment has, for example, a plurality of semiconductor elements and a plurality of wiring layers (multilayer wiring) coupling the semiconductor elements and a semiconductor integrated circuit includes the semiconductor elements and the multilayer wiring. Hereinafter, as an example of the semiconductor integrated circuit device, such a device that is applied to, for example, a hard disk drive (HDD) IC, is illustrated and explained.

FIG. 1 is a circuit block diagram of a semiconductor integrated circuit device. As shown in FIG. 1, the semiconductor integrated circuit device includes, for example, an input/output (I/O) circuit, an analog circuit, a CMISFET-logic circuit, a power MISFET circuit, and a memory circuit formed on a device surface of a semiconductor chip 1A, and these constitute the semiconductor integrated circuit device.

Among the circuits constituting the semiconductor integrated circuit device, the CMISFET-logic circuit includes, for example, a CMIS transistor the operating voltage of which is 1 to 3 V and the I/O circuit and the memory circuit include, for example, CMIS transistors the operating voltages of which are 1 to 3 V and 5 to 8 V.

The CMIS transistor the operating voltage of which is 1 to 3 V includes a first n-channel type MISFET (Metal Insulator Semiconductor Field Effect Transistor) having a first gate insulating film and a first p-channel type MISFET having the first gate insulating film. The CMIS transistor the operating voltage of which is 5 to 8 V includes a second n-channel type MISFET having a second gate insulating film and a second p-channel type MISFET having the second gate insulating film. The film thickness of the second gate insulating film is configured so as to be greater than that of the first gate insulating film. In the following explanation, MISFET is referred to as a MIS transistor.

The analog circuit includes, for example, a CMIS transistor (or bipolar transistor) the operating voltage of which is 5 to 8 V, a resistor element, and a capacitor element and the power MISFET circuit includes, for example, a CMIS transistor the operating voltage of which is 5 to 8 V and a high withstand voltage MIS transistor (high withstand voltage element) the operating voltage of which is 20 V to 100 V.

A high withstand voltage MIS transistor includes, for example, a third n-channel type MISFET having a third gate insulating film or a third p-channel type MISFET having the third gate insulating film or both. When a voltage of 20 V to 100 V is applied between a gate electrode and a drain region or between the gate electrode and a source region, the film thickness of the third gate insulating film is configured so as to be greater than that of the second gate insulating film.

Figure 2:
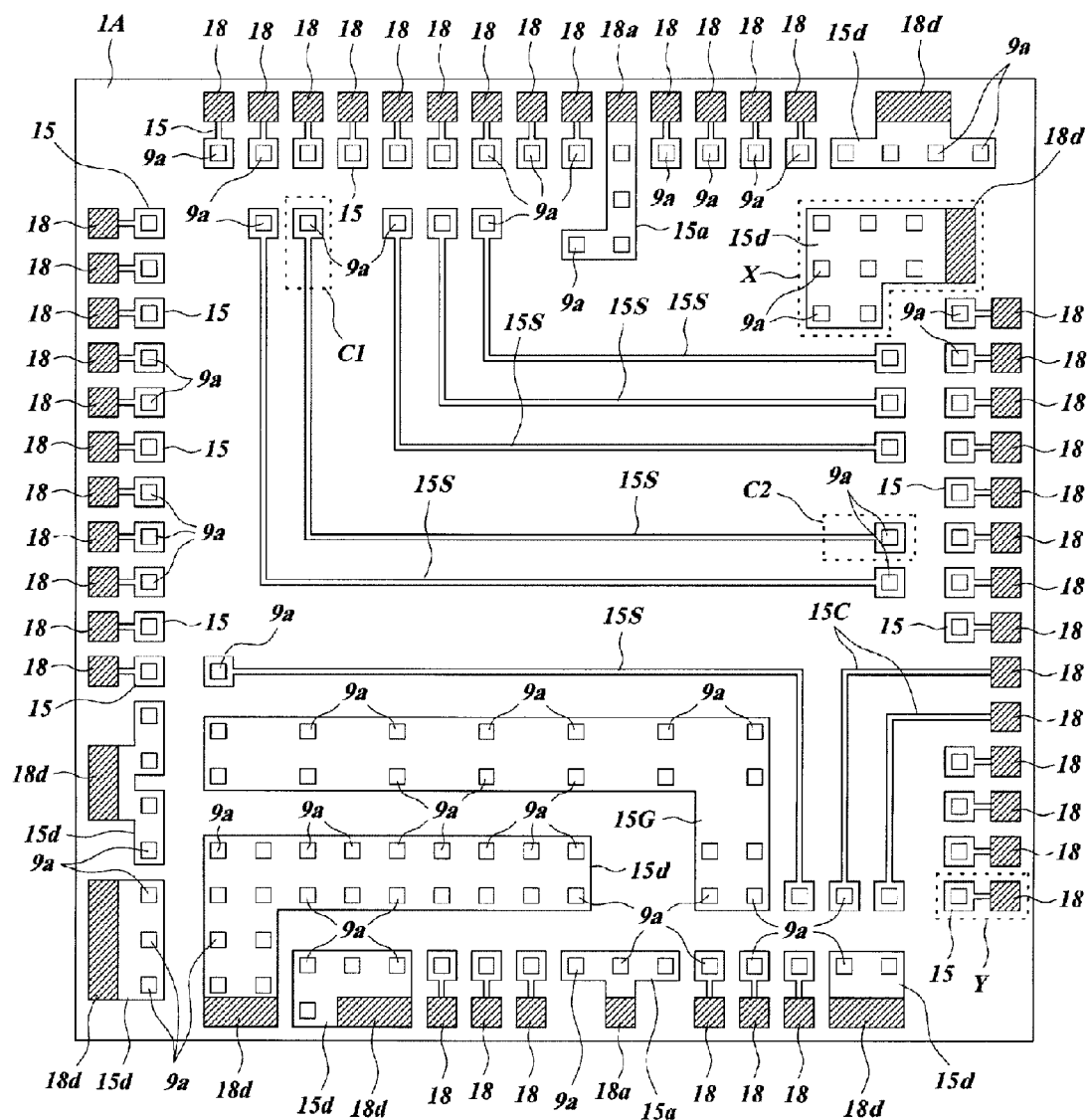
FIG. 2 is a plan view of a semiconductor chip on which a semiconductor integrated circuit device, an embodiment of the present invention, is formed.
Figure 3:
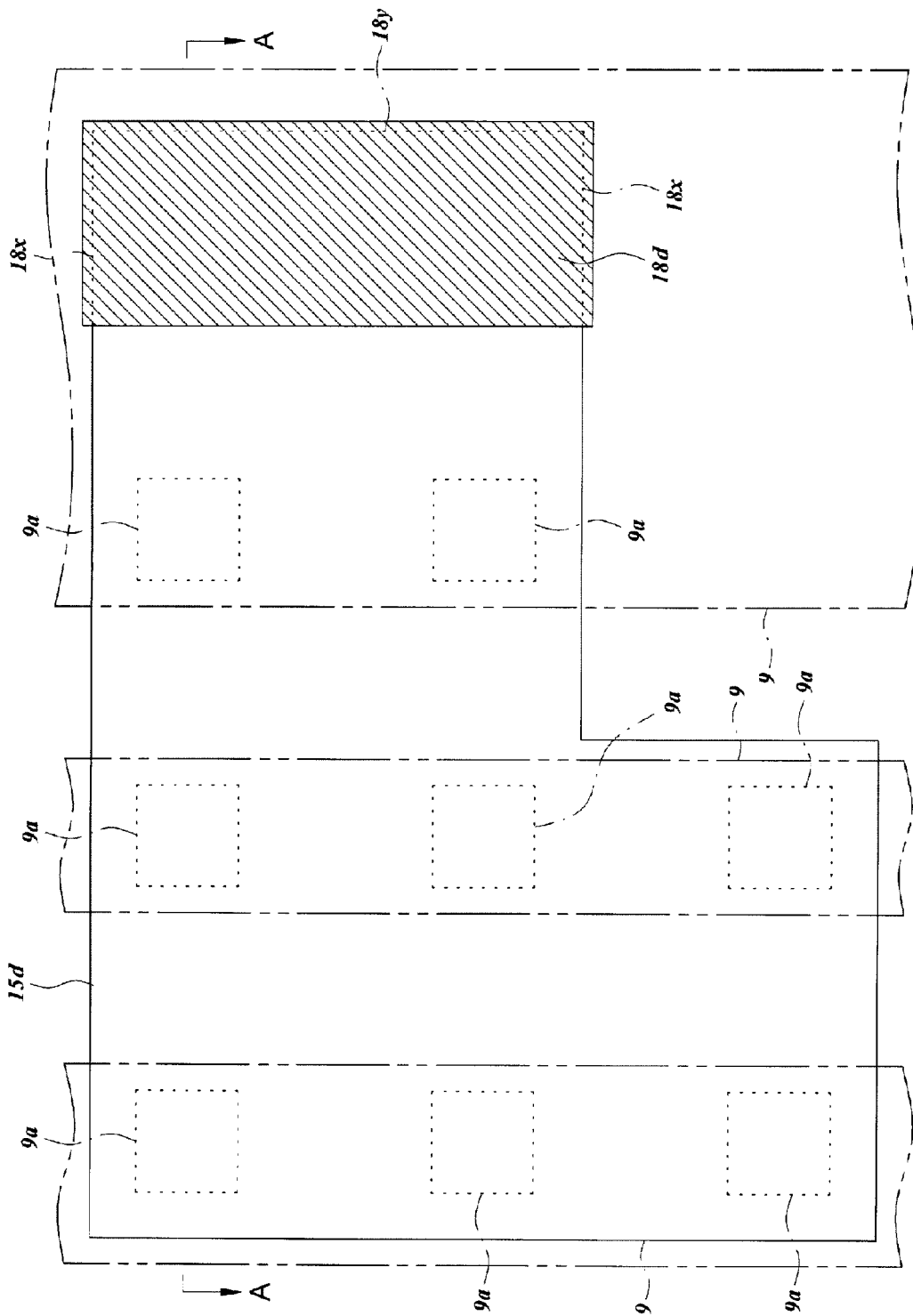
FIG. 3 is an enlarged plan view of part in FIG. 2.
Figure 4:
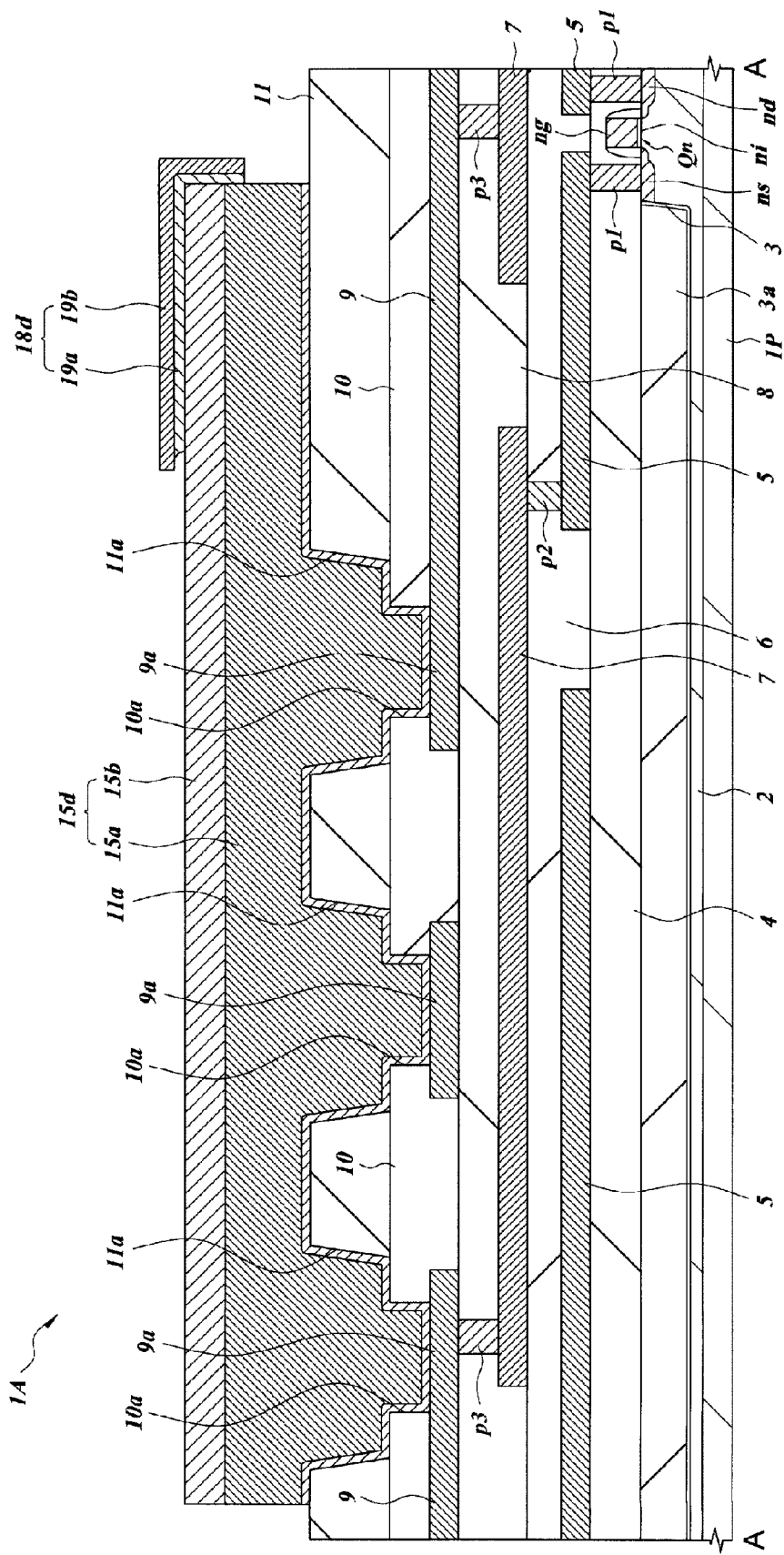
FIG. 4 is a section view along A-A line in FIG. 3.
Figure 5:
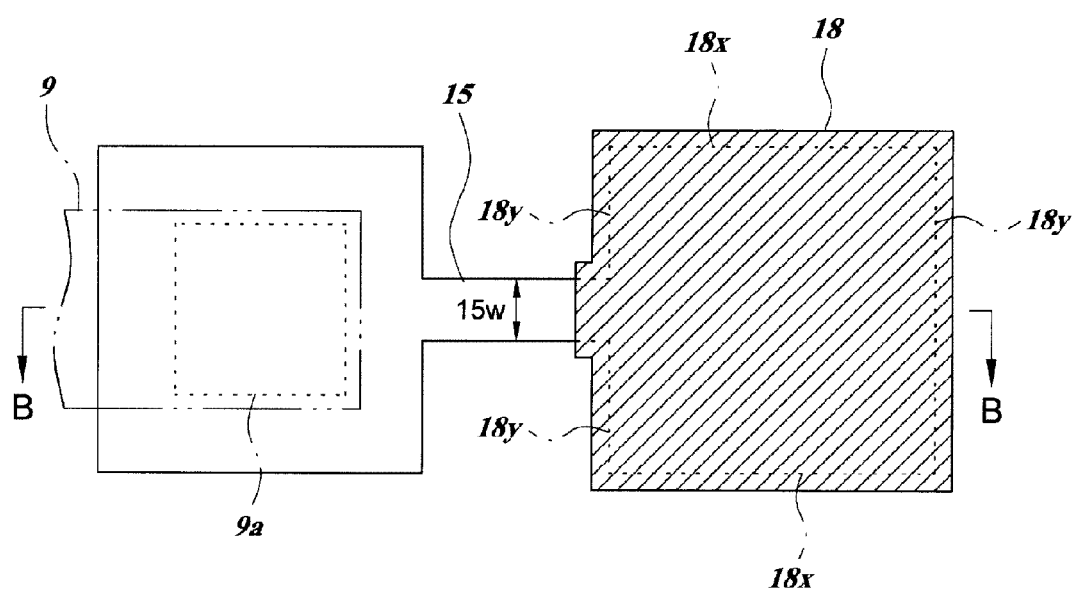
FIG. 5 is an enlarge plan view of part in FIG. 2.
Figure 6:
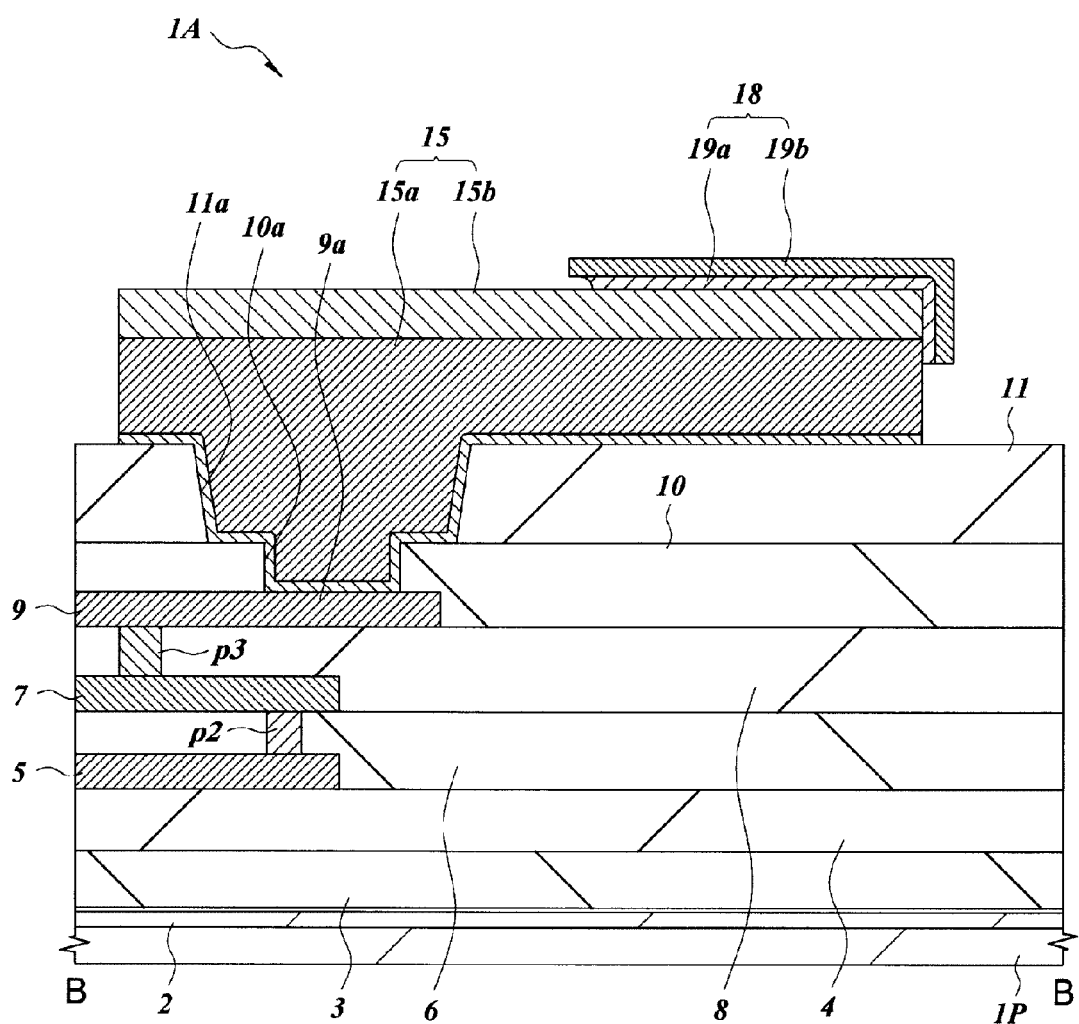
FIG. 6 is a section view along B-B line in FIG. 5.
Figure 28:
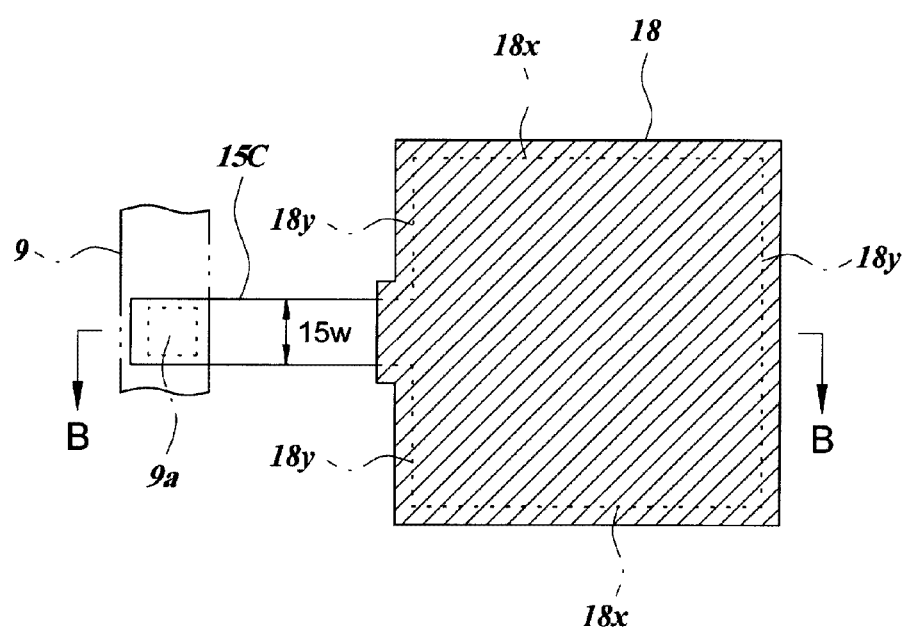
FIG. 28 is a plan view showing another example of a plane showing part in FIG. 2 in an enlarged view.

FIG. 2 is a general plan view showing an example of the semiconductor chip 1A on which the above-mentioned circuits are formed, FIG. 3 is an enlarged plan view of a region surrounded by a broken line X in FIG. 2, FIG. 4 is a section view along A-A line in FIG. 3, FIG. 5 is an enlarged plan view of a region surrounded by a broken line Y in FIG. 2, and FIG. 6 is a section view along B-B line in FIG. 5. FIG. 28 is an enlarged plan view showing another example in FIG. 5. It may also be possible to constitute a rewiring 15 and a pad 18 shown in FIG. 2 into the shape of a planar pattern shown in FIG. 28. Further, it is of course possible to mixedly include the rewirings 15 and the pads 18 in the shape of the planar pattern shown in FIG. 5 and FIG. 28.

As shown in FIG. 4, on a semiconductor substrate 1P including, for example, p-type single crystal silicon, a p-type well 2 and an element isolation groove 3 are formed and within the element isolation groove 3, for example, an element isolation insulating film 3a including, for example, a silicon oxide film, is filled.

Over the p-type well 2, an n-channel type MIS transistor (Qn) is formed. The n-channel type MIS transistor (Qn) has a source region ns and a drain region nd formed in the p-type well 2 in an active region defined by the element isolation groove 3 and a gate electrode ng formed over the p-type well 2 via a gate insulating film ni. On the actual semiconductor substrate 1P, semiconductor elements, such as an n-type well, a p-channel type MIS transistor, a resistor element, and a capacitor element, are formed, however, FIG. 4 shows the n-channel type MIS transistor (Qn) as an example of a semiconductor element constituting a semiconductor integrated circuit device. The source region ns, the drain region nd, and the gate electrode ng of the n-channel type MIS transistor (Qn), an example of a semiconductor element, are electrically coupled to another semiconductor element or power source wire via a multilayer wiring, to be described later.

On the top of the n-channel type MIS transistor (Qn), a wiring including a metal film that couples semiconductor elements is formed. The wiring that couples the semiconductor elements has a multilayer structure of generally three to ten layers, however, FIG. 4 shows, as an example of a multilayer wiring, a three-layer wiring (first layer Al wiring 5, second layer Al wiring 7, third layer Al wiring 9) including a metal film containing an Al alloy as a main component. Between the n-channel type MIS transistor (Qn) and the first layer Al wiring 5, between the first layer Al wiring 5 and the second layer Al wiring 7, and between the second layer Al wiring 7 and the third layer Al wiring 9, interlayer insulating films 4, 6, 8 each including a silicon oxide film etc and plugs p1, p2, p3 that electrically couple the three-layer wirings are formed.

The interlayer insulating film 4 is formed over the semiconductor substrate 1P so as to cover, for example, the semiconductor element and the first layer Al wiring 5 is formed over the interlayer insulating film 4. The first layer Al wiring 5 is electrically coupled to the source region ns, the drain region nd, and the gate electrode ng of the n-channel type MIS transistor (Qn), which is a semiconductor element, via, for example, the plug p1 formed in the interlayer insulating film 4. The second layer Al wiring 7 is electrically coupled to the first layer Al wiring 5 via, for example, the plug p2 formed in the interlayer insulating film 6. The third layer Al wiring 9 is electrically coupled to the second layer Al wiring 7 via, for example, the plug p3 formed in the interlayer insulating film 8. The plugs p1, p2, p3 include a metal film, for example, a W (tungsten) film.

When forming a multilayer wiring (three-layer wiring) by a metal film containing Cu as a main component using the chemical mechanical polishing method (CMP method), it is of course possible to form it using the dual damascene method in which a wiring and a plug are formed integrally. Further, it is of course possible to constitute the interlayer insulating films 4, 6, 8 by a single-layer film or laminated film of a silicon oxide film containing carbon (SiOC film), a silicon oxide film containing nitrogen and carbon (SiCON film), and a silicon oxide film containing fluorine (SiOF film).

On the top of the third layer Al wiring 9, which is a wiring layer in the uppermost layer of the multilayer wiring, as a final passivation film, a single-layer film of, for example, a silicon oxide film, a silicon nitride film, etc., or a surface protection film (protection film) 10 including a two-layer film of these films is formed. Then, the third layer Al wiring 9, which is a wiring layer in the uppermost layer, exposed at the bottom of a pad opening 10a formed in the surface protection film 10 constitutes an Al pad (first electrode pad) 9a, which is an electrode pad.

The third layer Al wiring 9 constitutes a wiring integrally formed to, for example, an electrode pad, a wiring that is not coupled to the electrode pad, etc., not limited to the electrode pad. The wiring that is not coupled to the electrode pad is used as a wiring that electrically couples semiconductor elements or circuits to constitute a semiconductor integrated circuit.

On the top of the surface protection film 10, a polyimide resin film (second insulating film) 11, which is an insulating film having an opening 11a above the pad opening 10a, is formed. Further, on the top of the polyimide resin film 11, the rewiring 15 electrically coupled to the Al pad 9a through the opening 11a of the polyimide resin film 11 and the pad opening 10a of the surface protection film 10 is formed.

The rewiring 15 includes a metal film including a two-layer film in which, for example, a Ni (nickel) film 15b is laminated on the top of a Cu film 15a and the film thickness thereof is configured so as to be greater than that of the wires (first layer Al wiring 5, second layer Al wiring 7, third layer Al wiring 9) in the lower layer. That is, the rewiring 15 includes an electrically conductive film having an electrical resistance smaller compared to that of the Al wirings (first layer Al wiring 5, second layer Al wiring 7, third layer Al wiring 9) in the lower layer and the wiring resistance thereof is configured so as to be smaller compared to that of the wirings (first layer Al wiring 5, second layer Al wiring 7, third layer Al wiring 9) in the lower layer.

FIG. 2 shows an example of a layout of the rewirings 15, 15a and rewirings 15d, 15S, 15G formed over the device surface of the semiconductor chip 1A. As shown in FIG. 2, on the periphery of the semiconductor chip 1A, a plurality of the rewirings (first rewirings) 15 constituting an external coupling terminal of the semiconductor integrated circuit device is arranged. In part (bonding area) of each of the rewirings 15 constituting the external coupling terminal of the semiconductor integrated circuit device, the pad (second electrode pad) 18, which is a pad layer, is formed. The pad 18 includes a two-layer film (see FIG. 4 and FIG. 6) in which, for example, an Au film 19b is laminated on the top of a Ni film 19a. Although not limited in particular, the pads (second electrode pads) 18 are arranged along each side of the semiconductor chip 1A. It is of course possible to arrange the pads (second electrode pads) 18 in a staggered shape along each side of the semiconductor chip 1A or in three or more rows.

As shown in FIG. 4 and FIG. 6, the pad 18 is formed integrally so as to cover, for example, part of the top surface and part of the side surface of the rewiring 15. Further, as shown in FIG. 5, the pad 18 is formed at part of each of the side surfaces of two sides 18x, 18x in opposition to the rewiring 15 and two sides 18y, 18y in opposition thereto in the perpendicular direction. The reason that the pad 18 is formed not only on the top surface but also on the side surface of the rewiring is to prevent the pad 18 from peeling off from the surface of the rewiring in the middle of the manufacturing step of the semiconductor integrated circuit device, to be described later.

As will be described later using FIG. 26, the adhesion properties with a resin (sealing resin) of the Au film 19a constituting the pad 18 are poorer compared to those of the Ni film 15 etc., however, it is possible to improve the reliability of adhesion between the resin 26 and the rewiring 15 (Ni film 15b) by selectively providing the pad 18 (Au film 19b) in part of the top surface of the rewiring 15, for example, in the region (region for which an alignment margin is considered) to be coupled to the external coupling terminal of the rewiring 15. That is, it is possible to improve the reliability of adhesion between the resin 26 and the rewiring 15 by constituting the uppermost surface of the rewiring 15 by the Ni film 15.

The rewiring 15 constituting the external coupling terminal of the semiconductor integrated circuit device is roughly classified into the rewiring 15 for signal input/output and the rewiring 15 for power source (Vcc, GND) supply. The rewiring 15 for signal input/output is electrically coupled to the Al wire (first layer Al wiring 5, second layer Al wiring 7, third layer Al wiring 9), which is a wiring for signal input/output, and the rewiring 15 for power source supply is electrically coupled to the Al wiring (first layer Al wiring 5, second layer Al wiring 7, third layer Al wiring 9), which is a wiring for power source supply.

As shown in FIG. 2, the rewiring 15d is configured so as to have an area larger than that of the rewiring 15 and the wiring width (line width) of the rewiring 15d is configured so as to be greater than the wiring width (line width) of the rewiring 15.

Further, a pad 18d formed in the rewiring 15d is configured so as to have an area larger than that of the pad 18 formed in the rewiring 15 and the width of the pad 18d formed in the rewiring 15d is configured so as to be greater than the width of the pad 18 formed in the rewiring 15.

For example, the rewiring 15d shown in FIG. 3 and FIG. 4 is an example of the rewiring 15d for power source supply and the rewiring 15 shown in FIG. 5, FIG. 28, and FIG. 6 is an example of the rewiring 15 for signal input/output. To the rewiring 15d for power source supply, for example, a plurality of the pads (Al pads) 9a is coupled and to the rewiring 15 for signal input/output, one pad (Al pad) 9a is coupled. Further, while to the pad 18 of the rewiring 15 for signal input/output, a bonding wire, which is one external coupling terminal, is electrically coupled, to the pad 18d of the rewiring 15d for power source supply, a plurality of bonding wires is electrically coupled. In this manner, the rewirings 15, 15d constitute the external coupling terminal of the semiconductor integrated circuit device.

As shown in FIG. 5, FIG. 28, and FIG. 6, the pad 18 is formed integrally so as to cover, for example, part of the top surface and the side surface, respectively, of the rewiring 15. That is, the pad 18 is formed in the plan pattern part in the shape of substantially a rectangle and a part 18z of the rewiring 15 formed extending to be coupled to the pad (Al pad) 9a so as to cover part of each of the side surfaces. The width of the planar pattern part is configured so as to be greater than that of a wiring part 15w extending to the pad (Al pad) 9a. In the planar pattern part, the pad 18 is formed in part of the side surface of the two sides 18x, 18x in opposition to each other and the two sides 18y, 18y in opposition to each other in the direction perpendicular thereto.

The reason that the pad 18 is formed not only on the top surface but also on the side surface of the rewiring 15 is to prevent the pad 18 from peeling off from the surface of the rewiring 15 in the middle of the manufacturing step of the semiconductor integrated circuit device, to be described later using FIG. 22. The pad 18 is formed in the part 18z of the side surface of the rewiring 15 formed extending to be coupled to the pad (Al pad) 9a, and therefore, the area of contact between them becomes large and it is possible to prevent the pad 18 from peeling off from the surface of the rewiring 15 more securely.

As shown in FIG. 3 and FIG. 4, for example, the pad 18d formed in the rewiring 15d for power source supply has an area larger than that of the pad 18 formed in the rewiring 15 for signal input/output. Consequently, even if the pad 18d is provided in part of the side surface with three or less sides, the area of contact between them becomes large, and therefore, it is possible to prevent the pad 18d from peeling off from the surface of the rewiring 15 in the middle of the manufacturing step of the semiconductor integrated circuit device, to be described later using FIG. 22.

Further, as will be described later using FIG. 26, the adhesion properties of the Au film 19b constituting the pad 18 with the resin (sealing resin) 26 are poorer compared to those of the Ni film 15b etc. As shown in FIG. 3 and FIG. 4, by selectively providing the pad 18d (Au film 19b) in part of the top surface of the rewiring 15d, for example, in the region (region for which an alignment margin is considered) that is coupled to the external coupling terminal of the rewiring 15d, it is possible to improve the reliability of adhesion between the resin 26 and the rewiring 15d (Ni film 15b). That is, by constituting the uppermost surface of the rewiring 15d by the Ni film 15b, it is possible to improve the reliability of adhesion between the resin (sealing resin) 26 and the rewiring 15d.

There is a case where a region (15C) that couples the pad 9a and the pad 18 increases in length depending on the arrangement also in the rewiring 15 for signal input/output shown in FIG. 2, FIG. 5, FIG. 28, and FIG. 6, and therefore, it is possible to improve the reliability of adhesion between the resin 26 and the rewiring 15 (Ni film 15b) by selectively providing the pad 18 (Au film 19b) in part of the top surface of the rewiring 15, for example, in the region (region for which an alignment margin is considered) that is coupled to the external coupling terminal of the rewiring 15. That is, by constituting the uppermost surface of the rewiring 15 by the Ni film 15b, it is possible to improve the reliability of adhesion between the resin 26 and the rewiring 15.

As shown in FIGS. 2, 3, 4, and FIG. 24 to be described later, for example, the rewiring 15d for power source supply is formed extending from the periphery of the semiconductor chip 1A to the interior of the semiconductor chip 1A and electrically coupled to the wiring (third layer Al wiring 9) or the pads (Al pads) 9a via the openings 10a, the wiring layers in the uppermost layer. The third layer Al wiring 9 is electrically coupled to, for example, the second layer Al wirings 7, the lower wiring layers, the second layer Al wirings 7 are electrically coupled to the first layer Al wirings 5, the lower wiring layers, and the first layer Al wirings 5 are electrically coupled to the semiconductor element. In this manner, the rewiring 15d is electrically coupled to the semiconductor element or the semiconductor integrated circuit via the multilayer wiring. Further, the number of the pads (Al pads) 9a electrically coupled to the pad 18d is configured so as to be larger than the number of bonding wires (external coupling terminals) 20 electrically coupled to the pad 18d.

The rewiring 15d is electrically coupled to the third layer Al wirings 9 via the openings 10a and the number of the third layer Al wirings 9 electrically coupled to the rewiring 15d is configured so as to be larger than the number of the bonding wires (external coupling terminals) 20 electrically coupled to the rewiring 15d. Further, the respective third layer Al wires 9 are electrically coupled to the rewiring 15d via the openings 10a ((Al pads) 9a) and the number of the openings 10a arranged respectively in the third layer Al wires 9 is configured so as to be larger than the number of the bonding wires (external coupling terminals) 20 electrically coupled to the rewiring 15d. It may also be possible to constitute part or the whole of the third layer Al wirings 9 so as to be formed integrally. That is, it is possible to constitute the third layer Al wiring 9 by a thick wiring in which a slit is formed.

As described above, in the present embodiment, the rewiring 15d having a low resistance value is configured so as to have a great wiring width (line width) and electrically coupled to the third layer Al wirings 9 via the opening 10a or to the semiconductor element or the semiconductor integrated circuit via the pads (Al pads) 9a. Due to this, the number of the bonding wires (external coupling terminals) 20 can be reduced compared to the case where one pad (Al pad) 9a is provided corresponding to one bonding wire (external coupling terminal) 20 and its pairs are provided in the number corresponding to the number of the pads (Al pads) 9a, and therefore, it is possible to increase the degree of freedom in wiring design of the rewiring 15 and the three-layer wiring (first layer Al wirings 5, second layer Al wiring 7, third layer Al wiring 9).

Further, by constituting the rewiring 15d for power source supply having a low resistance value so as to have a great wiring width (line width) and electrically coupling it to the semiconductor element or the semiconductor integrated circuit via the third layer Al wiring 9 or the pads (Al pads) 9a, the ON resistance can be reduced and the voltage of the power source etc. can be stabilized, and therefore, it is possible to stably supply power source to the semiconductor element or the semiconductor integrated circuit. Furthermore, it is possible to improve the characteristics of the semiconductor integrated circuit device.

Figure 24:
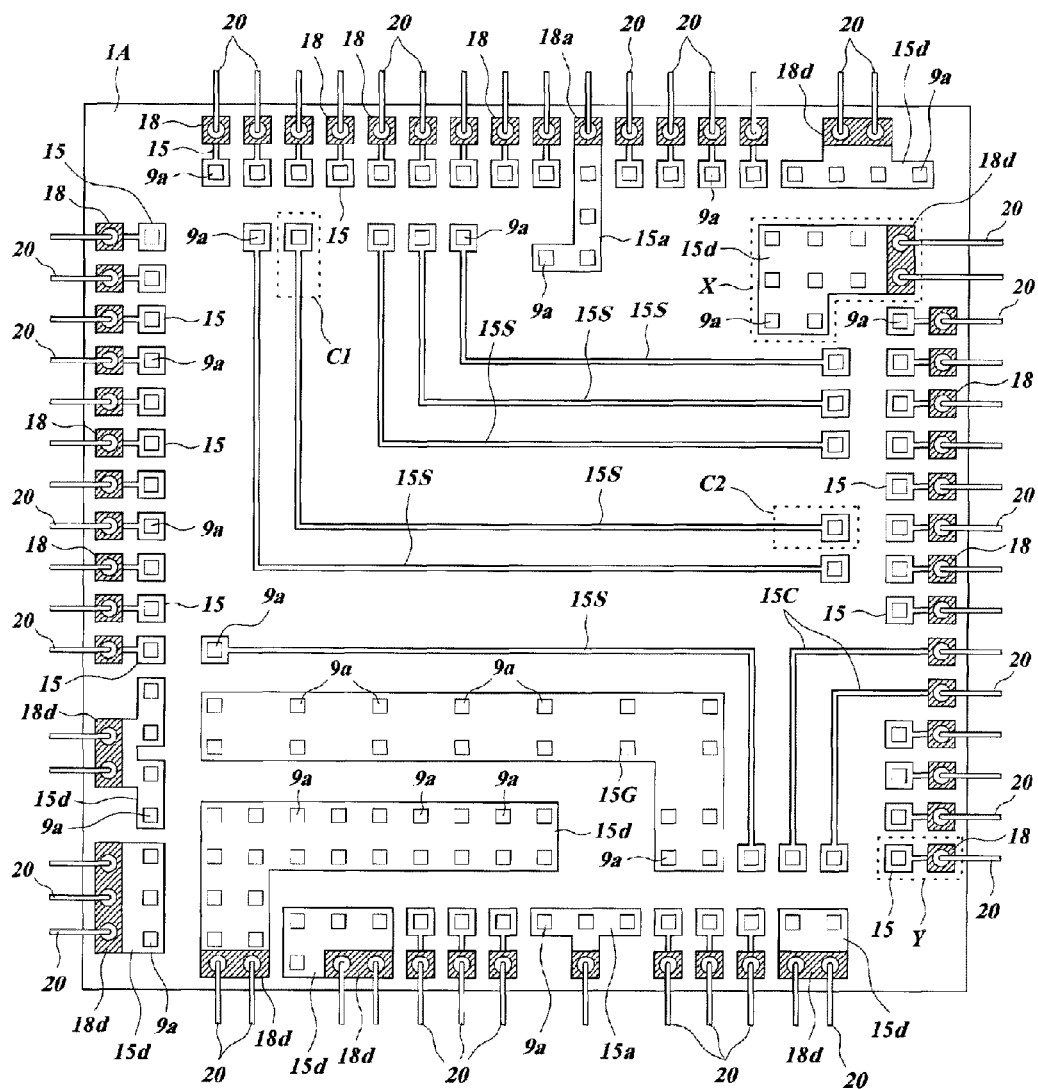
FIG. 24 is a plan view showing a device surface of a semiconductor chip to which a wire is coupled.

In the present embodiment, as shown in FIG. 2 and FIG. 24, even if the rewiring 15a has a wiring width configured so that the pad 18a is electrically coupled to one bonding wire (external coupling terminal) 20, the rewiring 15a having a lower resistance value is provided extending and electrically coupled to the semiconductor element or the semiconductor integrated circuit via the pads (Al pads) 9a or the third layer Al wire 9. Due to this, similar to that described above, the number of the bonding wires (external coupling terminals) 20 can be reduced, and therefore, it is possible to increase the degree of freedom in line designing of the rewiring 15 and the three-layer wiring (first layer Al wiring 5, second layer Al wiring 7, third layer Al wiring 9). Further, by electrically coupling the rewiring 15 having a low resistance value to the semiconductor element or the semiconductor integrated circuit via the pads (Al pads) 9a or the third layer Al wiring 9, the ON resistance can be reduced and the voltage of the power source etc. can be stabilized, and therefore, it is possible to stably supply a signal/voltage to the semiconductor element or the semiconductor integrated circuit. In this manner, the rewiring 15a constitutes the external coupling terminal.

As shown in FIG. 2, FIG. 28, the wiring width (line width) of the rewiring 15d is configured so as to be greater than the wiring width (line width) of the rewiring 15C for signal input/output and the number of the openings 10a to electrically couple the rewiring 15d and the pad (Al pad) 9a or the third layer Al wiring 9 is configured so as to be larger than the number of the openings 10a to electrically couple the rewiring 15C and the pad (Al pad) 9a or the third layer Al wiring 9. Further, the number of the pads (Al pads) 9a or the third layer Al wirings 9 coupled to the rewiring 15d is configured so as to be larger than the number of the pads (Al pads) 9a or the third layer Al wirings 9 coupled to the rewiring 15C. Due to this, the ON resistance can be reduced and the voltage of the power source etc. can be stabilized, and therefore, it is possible to improve the characteristics of the semiconductor integrated circuit device.

As the rewiring 15d having a great wiring width, a rewiring for power source supply is illustrated and explained above, however, the rewiring 15d is not limited to a rewiring for power source supply and it may also be possible to constitute a rewiring for signal to transmit a signal. For example, it may also be possible to use the rewiring 15d as a wiring to transmit a voltage of about 10 V to 100 V and electrically couple it to the drain of a high withstand voltage MIS transistor (high withstand voltage element). Further, it may also be possible to use the rewiring 15d having a great wiring width as a wiring the resistance value of which is desired to be reduced for high-speed operation.

As shown in FIG. 2, for example, in the region inside the external coupling terminal (rewiring 15) arranged on the periphery of the semiconductor chip 1A, the other rewirings 15S, 15G not constituting the external coupling terminal of the semiconductor integrated circuit device or not coupled directly to the external coupling terminal are formed. These rewirings 15S, 15G are wirings to couple the third layer Al wirings 9, the uppermost wiring layers in the three-layer wiring, and substantially function as fourth wiring layers. That is, the rewirings 15S, 15G are the rewirings 15 not coupled directly to the external coupling terminal, and therefore, in these rewirings 15S, 15G, the pad 18 is not formed.

As will be described later using FIG. 26, the adhesion properties of the Au film 19b with the resin (sealing resin) 26 are poorer compared to those of the Ni film 15b etc., however, by not forming the pad 18 (Au film 19b) in the rewirings 15S, 15G, it is possible to improve the reliability of adhesion between the resin (sealing resin) 26 and the rewirings 15S, 15G. That is, by constituting the uppermost surface of the rewirings 15S, 15G by the Ni film 15b, it is possible to improve the reliability of adhesion between the resin (sealing resin) 26 and the rewirings 15S, 15G.

As described above, by utilizing part (rewirings 15S, 15G) of the rewiring 15 formed on the top of the third layer Al wire 9, which is the uppermost wiring layer of the three-layer wiring (first layer Al wiring 5, second layer Al wiring 7, third layer Al wiring 9) that couples the semiconductor elements via the surface protection film 10 as the fourth wiring layer (wiring not coupled directly to the external coupling terminal), it is possible to increase the degree of freedom in designing of the three-layer wiring (first layer Al wiring 5, second layer Al wiring 7, third layer Al wiring 9). Further, by utilizing the rewirings 15, 15a, 15d, 15S, 15G having an electrical resistance smaller than that of the third wiring layer as the fourth wiring layer, the resistance of the wiring that couples the semiconductor elements can be reduced, and therefore, it is possible to reduce, for example, the ON resistance of a high withstand voltage MIS transistor constituting a power MISFET circuit. That is, the ON resistance per unit area can be reduced, and therefore, it is possible to reduce the area occupied by a circuit including a high withstand voltage element to make an attempt to reduce the chip area.

The rewiring 15S constitutes, for example, a signal wire to transmit a signal and electrically couples the Al wirings in the lower layer. The wire width of the rewiring 15G is configured so as to be greater than the wiring width of the rewiring 15S.

The rewiring 15S constitutes, for example, a signal wire to transmit a signal and is electrically coupled to the third layer Al wirings 9, the lower wiring layers. In this manner, the rewiring 15S electrically couples the three-layer wirings (first layer Al wiring 5, second layer Al wiring 7, third layer Al wiring 9) in the lower layer and is electrically coupled to semiconductor elements (C1, C2) or circuits (C1, C2) via the wiring layer in the lower layer. The wiring width of the rewiring 15G is configured so as to be greater than that of the rewiring 15S.

Of the rewirings 15S, 15G, the rewiring 15G larger in the area than the rewiring 15S is a wiring to couple, for example, the Al wirings for power source supply in the lower layer.

For example, like the rewiring 15d shown in FIG. 3, the rewiring 15G is electrically coupled to the third layer Al wirings 9, the lower wiring layers, and the third layer Al wirings 9 are electrically coupled to the second layer Al wirings 7, the lower wiring layers. The second layer Al wirings 7 are electrically coupled, for example, to the first layer Al wirings 5, the lower wiring layers, and the first layer Al wirings 5 are electrically coupled to the semiconductor element. Due to this, the ON resistance can be reduced and it is possible to stabilize the voltage of the power source etc.

Although not limited in particular, for example, the rewiring 15G is electrically coupled to the rewiring 15d via the third layer Al wiring 9. That is, the pad (Al pad) 9a exposed from the opening 10a formed in the surface protection film 10 is electrically coupled to the rewiring 15 through the third layer Al wiring 9 and the rewiring 15G is configured as a wiring for heat dissipation.

As described above, by increasing the area of the rewiring 15G coupled to the Al wiring for power source supply, the rewiring 15G functions as a heat dissipating plate, and therefore, it is made possible to let part of heat generated from a high withstand voltage MIS transistor constituting, for example, a power MISFET circuit escapes from the device surface side of the semiconductor chip 1A. Due to this, it is possible to improve the characteristics of the semiconductor integrated circuit device. It is also possible to obtain the same effect by constituting, for example, a signal wire to transmit a signal, for example, a signal wire to transmit a voltage of 10 V to 100 V by the rewiring 15G. Further, it is also possible to electrically couple the rewiring 15G, for example, to the drain of a high withstand voltage MIS transistor (high withstand voltage element).

Further, it may also be possible to constitute the third layer Al wirings 9 electrically coupled to the rewiring 15G so as to be formed integrally, respectively, and to constitute them by a thick wiring in which, for example, a slit is formed. Due to this, the heat dissipation properties can be improved. Furthermore, it may also be possible to constitute the second layer Al wirings 7 electrically coupled to the rewiring 15G so as to be formed integrally, respectively, and to constitute them by a thick wiring in which, for example, a slit is formed. Due to this, the heat dissipation properties can be improved.

The wire width of the rewiring 15G is configured so as to be greater than the wiring width of the rewiring 15S and the number of the openings 10a to electrically couple the rewiring 15G and the third layer Al wiring 9 is configured so as to be larger than the number of the openings 10a to electrically couple the rewiring 15S and the third layer Al wiring 9. Further, the number of the third layer Al wirings 9 electrically coupled to the rewiring 15G is configured so as to be larger than the number of the third layer Al wirings 9 electrically coupled to the rewiring 15S. Due to this, the ON resistance can be reduced and the voltage of the power source etc. can be stabilized, and therefore, it is possible to improve the characteristics of the semiconductor integrated circuit device.

Figure 7:
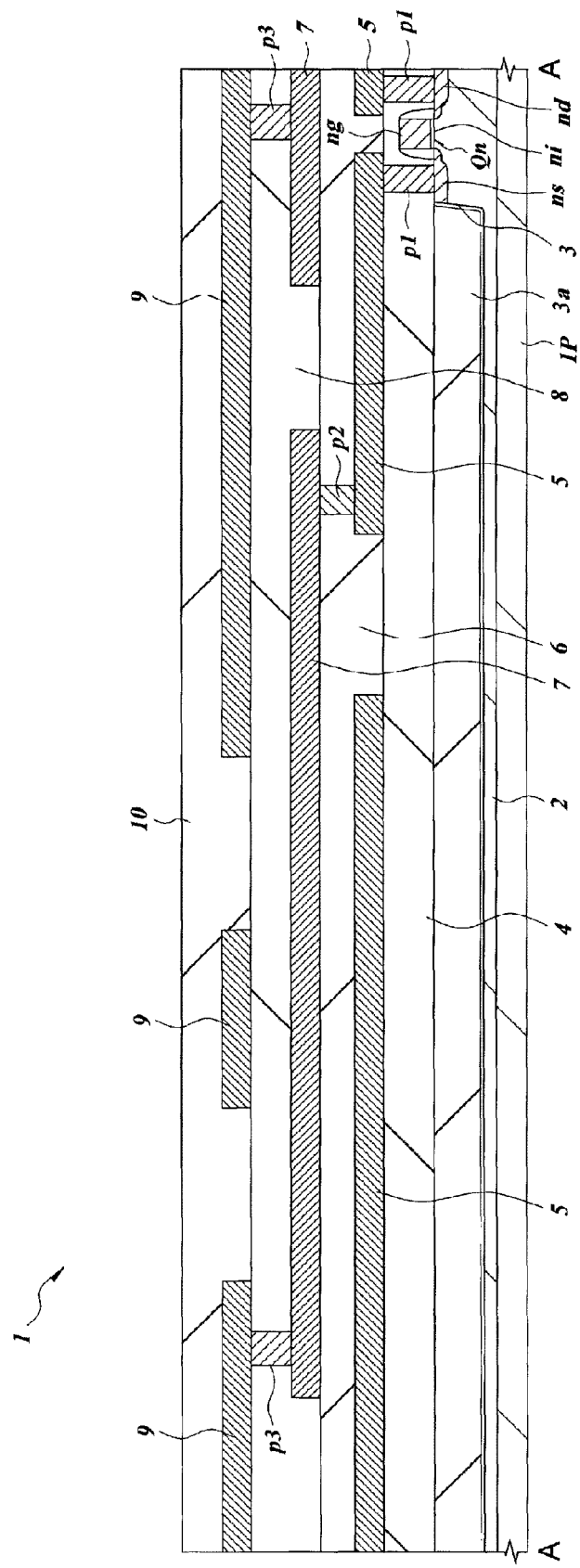
FIG. 7 is a section view showing a method of manufacturing a semiconductor integrated circuit device, an embodiment of the present invention.

Next, a method of manufacturing a semiconductor integrated circuit device (semiconductor device) in the present embodiment is explained in order of steps. FIG. 7 shows a state where semiconductor elements constituting a semiconductor integrated circuit device and a three-layer wiring (first layer Al wiring 5, second layer Al wiring 7, third layer Al wiring 9) to couple them are formed on the device surface of a semiconductor wafer 1 according to a normal manufacturing method and then the surface protection film 10 is deposited on the top of the third layer Al wiring 9.

That is, FIG. 7 shows a step of coating, with the surface protection film 10, the top of the device surface of the semiconductor wafer 1 on which the semiconductor elements (for example, an n-channel type MIS transistor Qn etc.) and the wiring layers (first layer Al wiring 5, second layer Al wiring 7, third layer Al wiring 9) to couple the semiconductor elements are formed. The surface protection film 10 includes, for example, a silicon oxide film, a silicon nitride film, or a two-layer film of these films and is formed on the top of the uppermost wiring layer (third layer Al wiring 9) of the wiring layers by the CVD (Chemical Vapor Deposition) method. In FIG. 7, as the semiconductor element constituting the semiconductor integrated circuit device, only the n-channel type MIS transistor (Qn) is shown.

Figure 8:
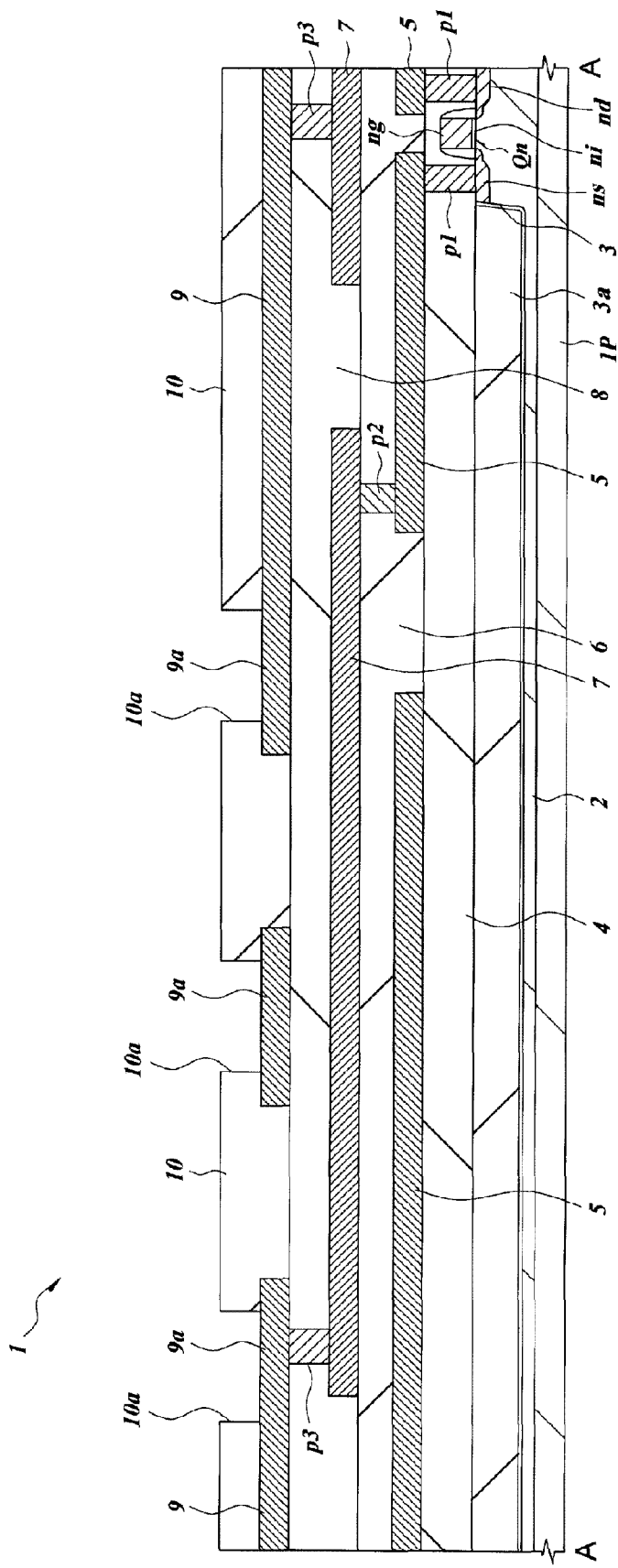
FIG. 8 is a section view showing a method of manufacturing a semiconductor integrated circuit device, following FIG. 7.

Next, as shown in FIG. 8, by dry etching using, for example, a photoresist film as a mask, the surface protection film 10 is etched and the pad opening 10a is formed in part thereof and part of the third layer Al wiring 9 is exposed, and thereby, the Al pad 9a, which is an electrode pad, is formed.

Figure 9:
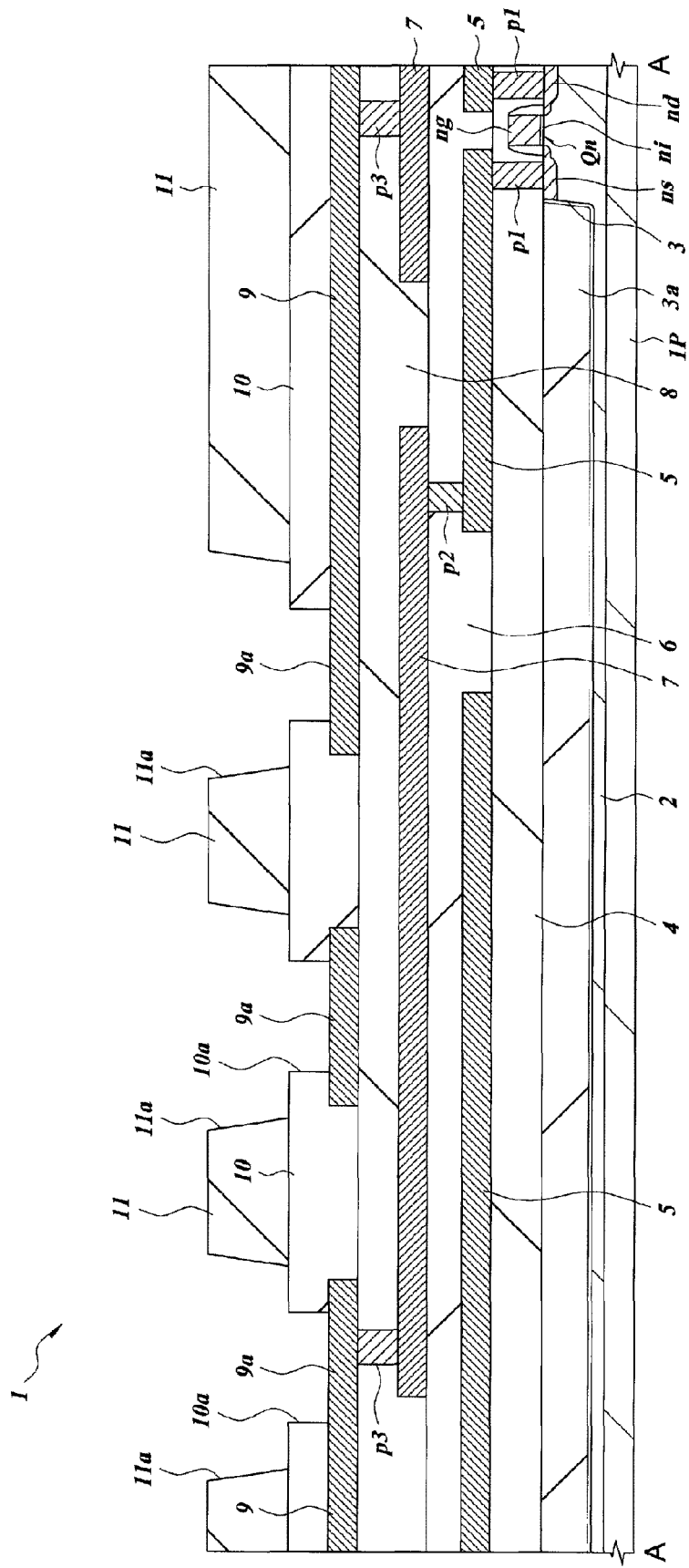
FIG. 9 is a section view showing a method of manufacturing a semiconductor integrated circuit device, following FIG. 8.

Next, as shown in FIG. 9, after depositing the polyimide resin layer (second insulating film) 11, which is an insulating film, on the top of, for example, the surface protection film 10, the opening 11a is formed in the polyimide resin film 11 above the Al pad 9a by dry etching using a photoresist film as a mask and thereby the Al pad 9a is exposed. That is, by etching the polyimide resin film 11 on the top of the Al pad 9a, the Al pad 9a is exposed.

Figure 10:
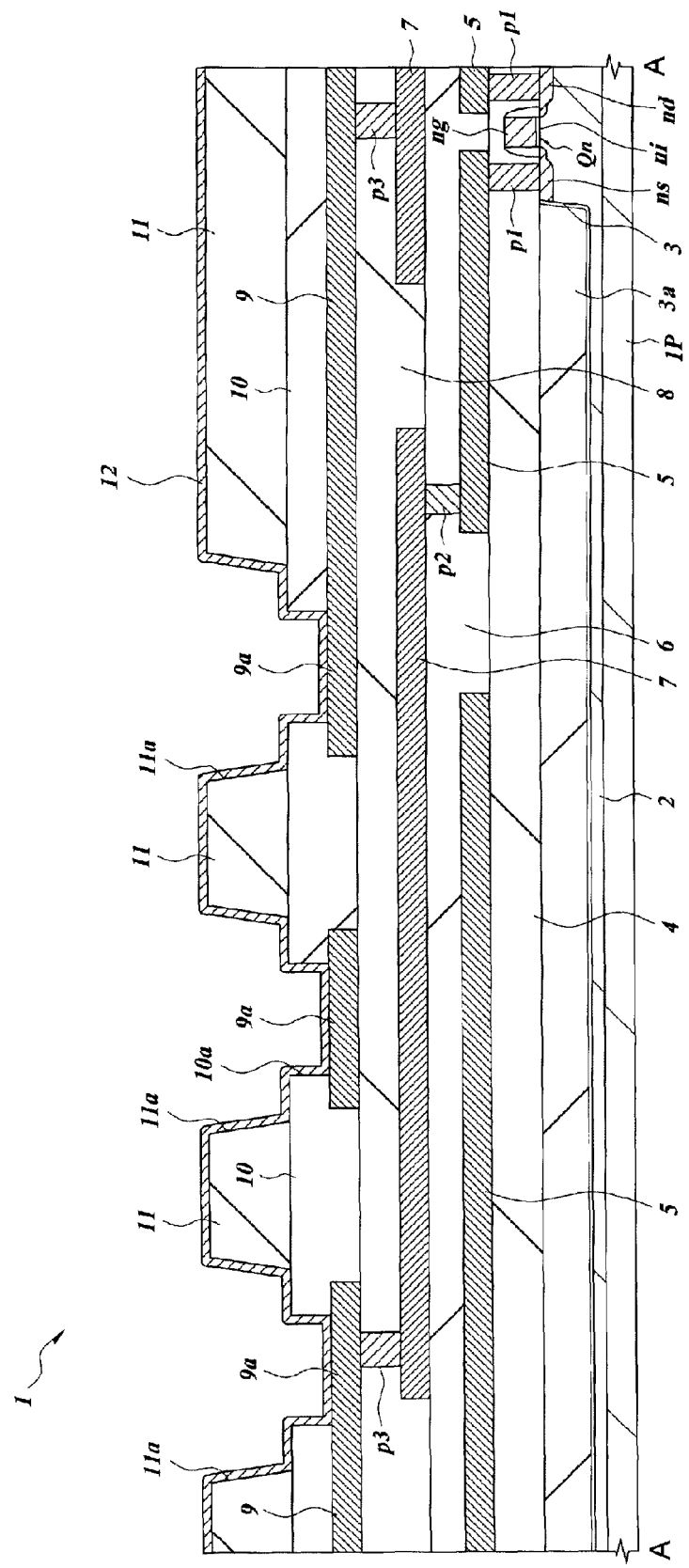
FIG. 10 is a section view showing a method of manufacturing a semiconductor integrated circuit device, following FIG. 9.

Next, as shown in FIG. 10, a seed film (metal seed film) 12 for Cu (copper) electroplating is deposited, for example, on the entire surface of the semiconductor wafer 1. That is, the seed film 12 is formed over the device surface including the top surface of the Al pad 9a. The seed film 12 includes a Cu (copper) film having a film thickness of about 250 nm deposited by, for example, the sputtering method. Although not shown schematically, prior to the deposition of the Cu (copper) film, a barrier metal film for preventing diffusion of Cu (copper) is deposited on the entire surface of the semiconductor wafer 1. The barrier metal film includes a Cr (chromium) film having a film thickness of about 75 nm deposited, for example, by the sputtering method. Consequently, the seed film 12 substantially includes a two-layer film of the barrier metal film (Cr film) and the Cu (copper) film. As the barrier metal film instead of the Cr film, a Ti (titanium) film, TiN (titanium nitride) film, WN (tungsten nitride) film, etc., can be used.

Figure 11:
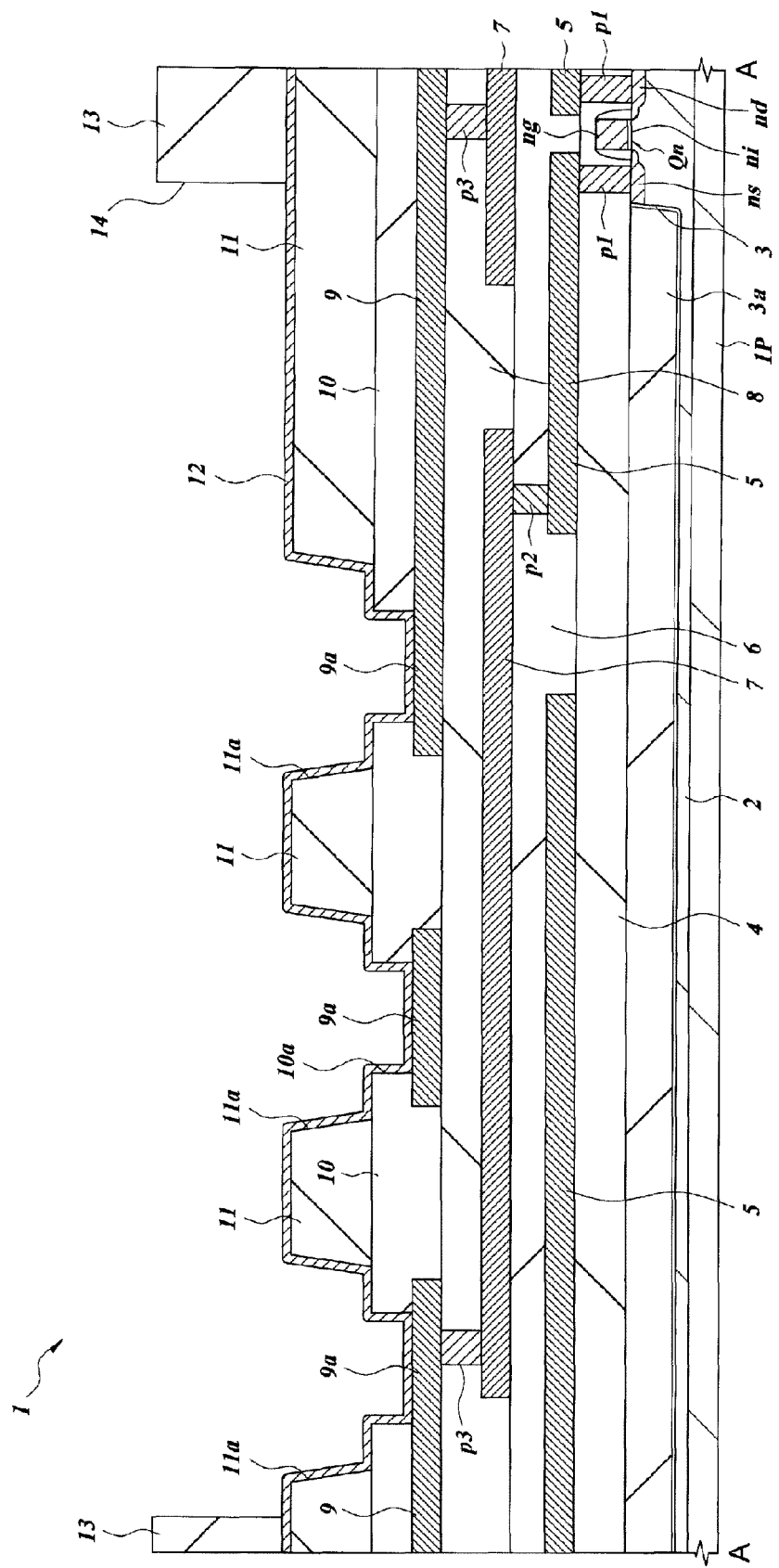
FIG. 11 is a section view showing a method of manufacturing a semiconductor integrated circuit device, following FIG. 10.

Next, as shown in FIG. 11, after depositing a photoresist film having a film thickness of about 8 to 12 μm, for example, on the entire surface of the semiconductor wafer 1, by exposing/developing the photoresist film, a photoresist film pattern 13 having an opening (first opening) in part thereof is formed.

Figure 12:
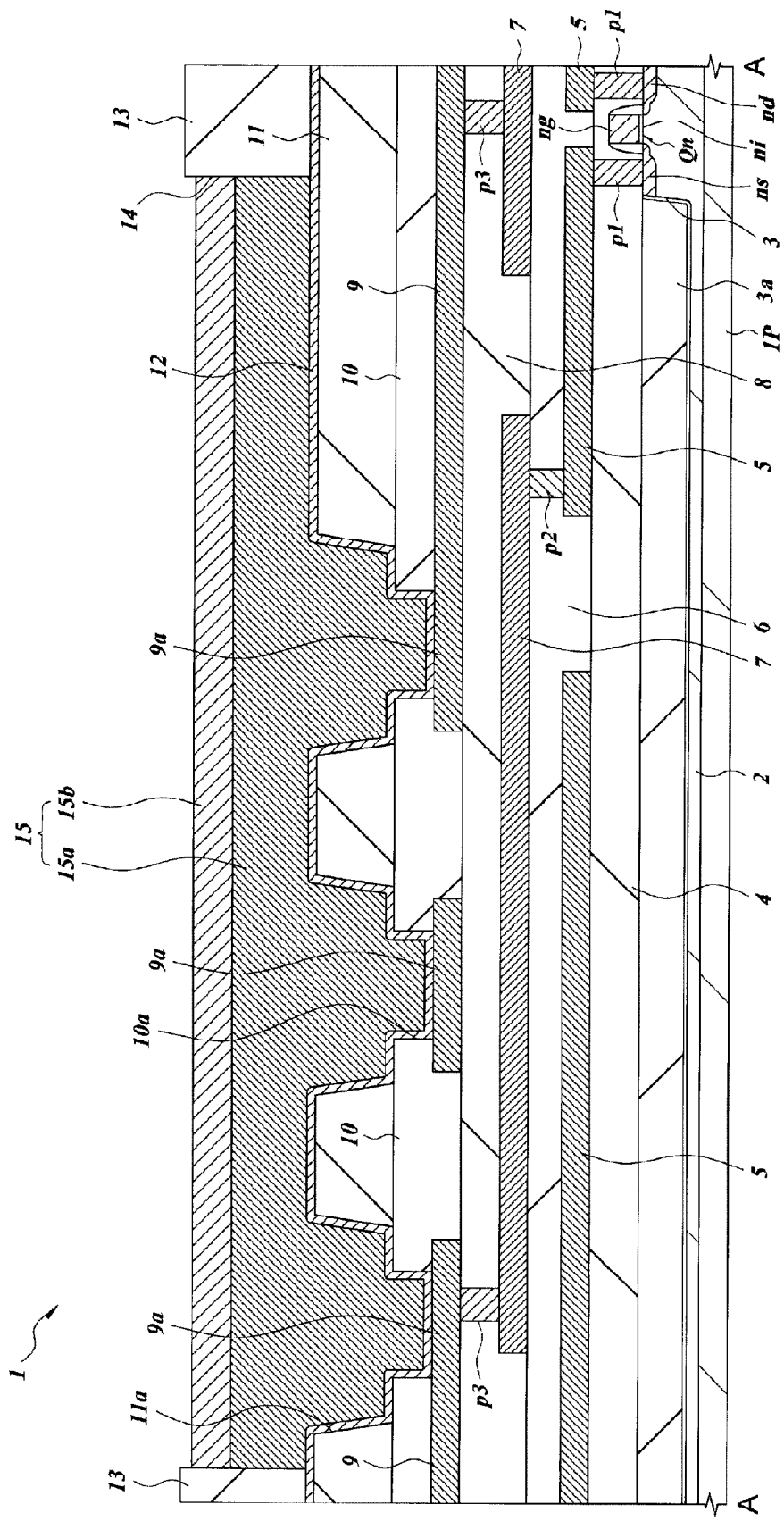
FIG. 12 is a section view showing a method of manufacturing a semiconductor integrated circuit device, following FIG. 11.

Next, as shown in FIG. 12, the Cu (copper) film 15a having a film thickness of about 6 to 8 μm is formed by the electroplating method on the surface of the seed film 12 exposed, for example, at the bottom of the opening 14 of the photoresist film pattern 13 and subsequently, the Ni (nickel) film 15b having a film thickness of about 1 to 3 μm is deposited on the surface of the Cu (copper) film 15a. Due to this, the rewiring 15 including a two-layer film of the Cu (copper) film 15a and the Ni (nickel) film 15b is formed. That is, on the top surface of the seed film 12 inside the opening 14, the rewiring 15 is formed by electroplating.

In the lower layer of the Cu (copper) film 15a, the seed film 12 is formed, and therefore, it can be said that the rewiring 15 includes a three-layer film of the seed film 12, the Cu (copper) film 15a, and the Ni (nickel) film 15b. One of the reasons that the uppermost surface of the rewiring 15 is configured by the Ni (nickel) film 15b is to improve the adhesion properties between the resin 26 to seal the semiconductor substrate 1 in the packaging step, to be described later using FIG. 26, and the rewiring 15. That is, the adhesion properties of the Ni (nickel) film 15b with a resin are more excellent compared to those of the Cu (copper) film 15a, and therefore, by constituting the uppermost surface of the rewiring 15 by the Ni (nickel) film 15b, it is possible to improve the reliability of adhesion between the resin 26 and the rewiring 15.

Figure 13:
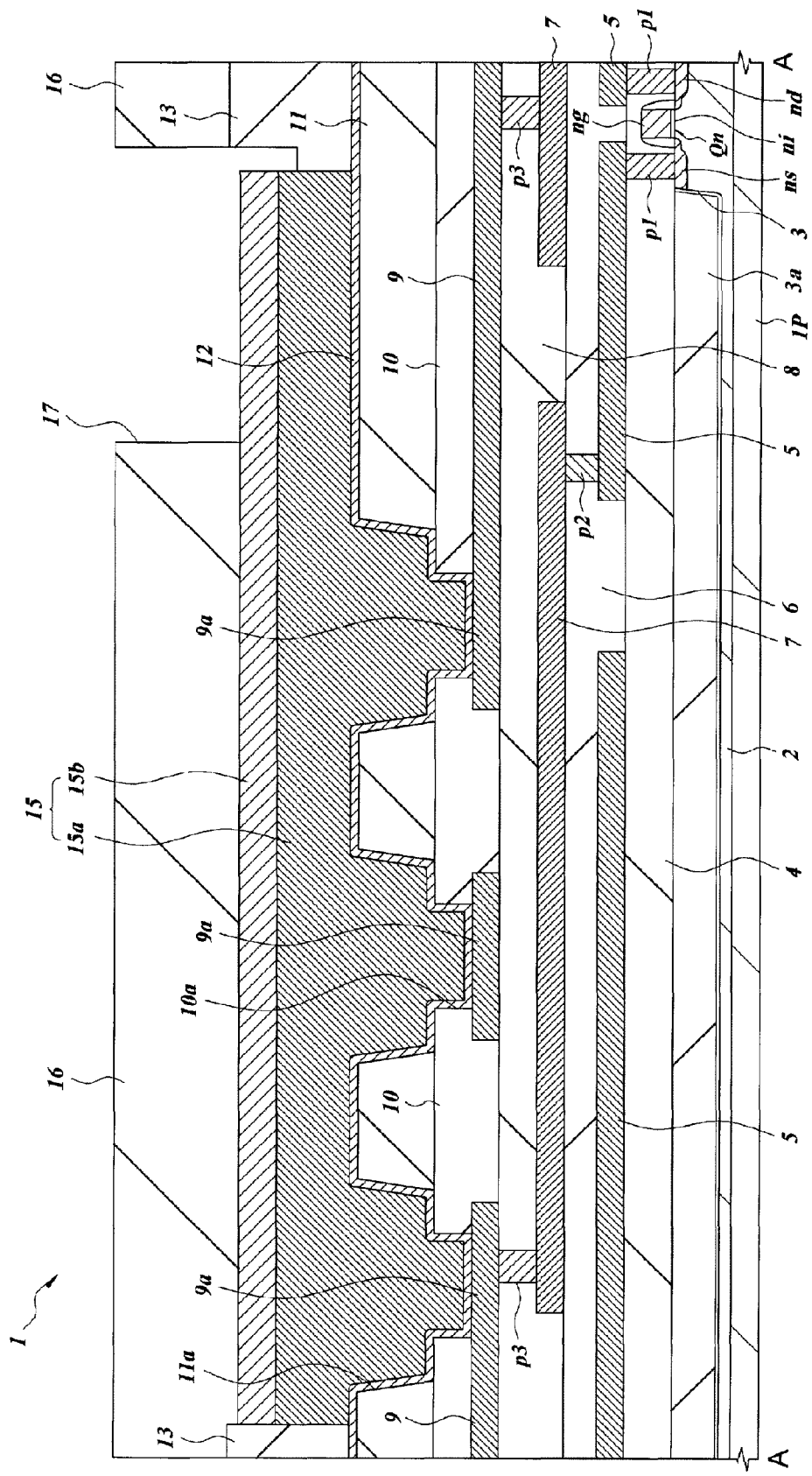
FIG. 13 is a section view showing a method of manufacturing a semiconductor integrated circuit device, following FIG. 12.

Next, as shown in FIG. 13, for example, while the photoresist film pattern 13 is left, by depositing a second photoresist film on the entire surface of the semiconductor wafer 1 and subsequently, by exposing/developing the photoresist film, a photoresist film pattern 16 having an opening (second opening) 17 in which part of the rewiring 15 is exposed is formed. At this time, the photoresist film pattern 13 on the bottom of the opening 17 is also exposed/developed, and therefore, part of the side surface of the rewiring 15 is exposed in the opening 17. As described above, by forming the second photoresist film pattern 16 while leaving the photoresist film pattern 13 over the semiconductor substrate 1, it is possible to reduce the number of manufacturing steps. That is, over the device surface of the semiconductor wafer 1, the second photoresist film pattern 16 having the second opening 17 inside which at least part of the top surface of the rewiring 15 and at least part of the side surface of the rewiring 15 are included is formed.

Figure 14:
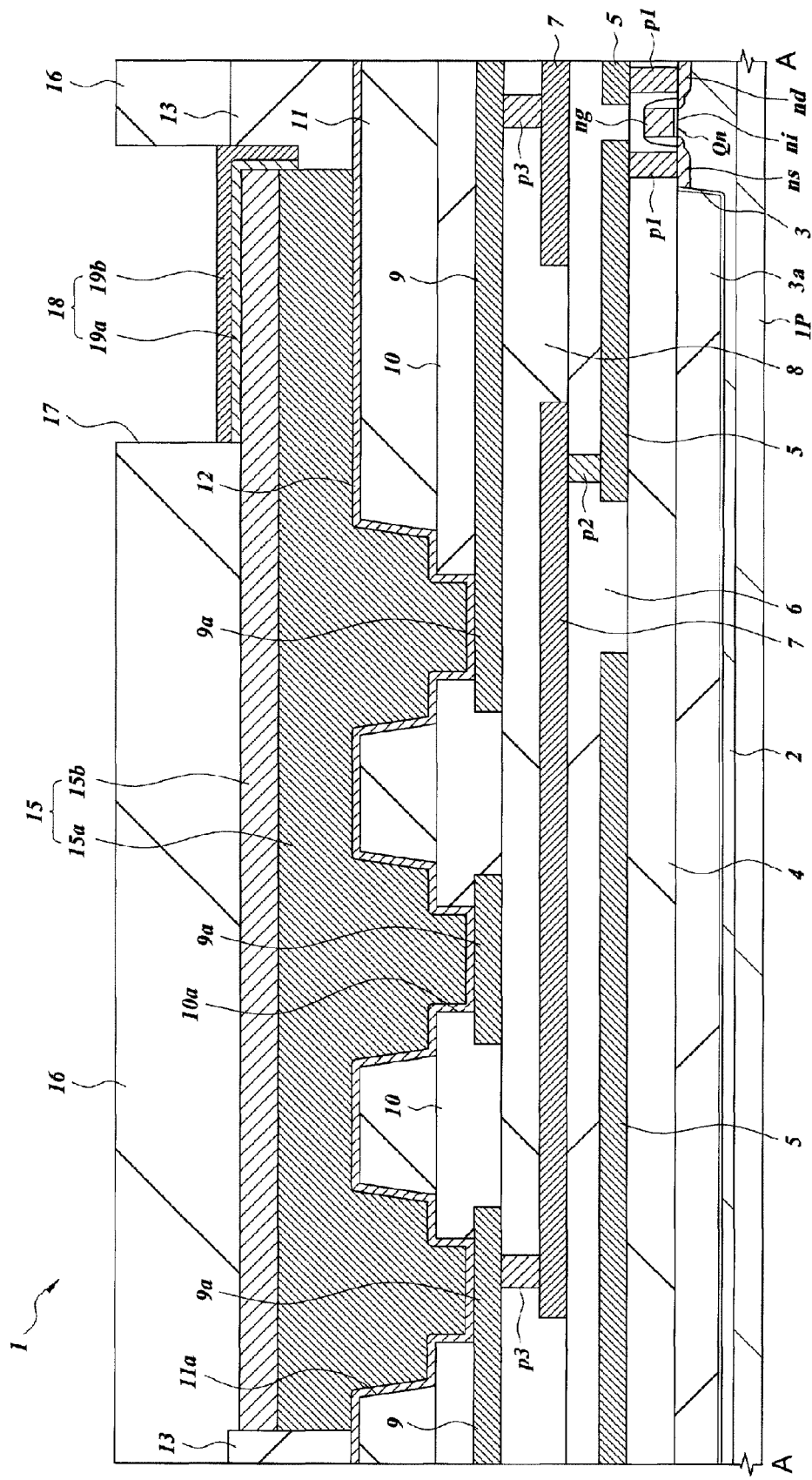
FIG. 14 is a section view showing a method of manufacturing a semiconductor integrated circuit device, following FIG. 13.

Next, as shown in FIG. 14, the Ni (nickel) film 19b having a film thickness of about 0.5 to 0.9 µm is deposited by the electroplating method on the surface (top surface and side surface) of the rewiring 15 exposed in the opening 17 of the photoresist film pattern 16 and subsequently, the Au (gold) film 19b having a film thickness of about 0.8 to 1.2 µm is deposited on the surface of the Ni (nickel) film 19b. As a plating liquid to form the Au (gold) film 19b, mention is made, for example, of a gold sodium sulfite based plating liquid as a preferable one. Due to this, the pad 18 including a two-layer film of the Ni (nickel) film 19a and the Au (gold) film 19b is formed in the bonding area of the rewiring 15. As described above, in the present embodiment, the pad 18 is formed integrally by electroplating on the top surface and side surface of the rewiring 15 inside the second opening 17.

Figure 15:
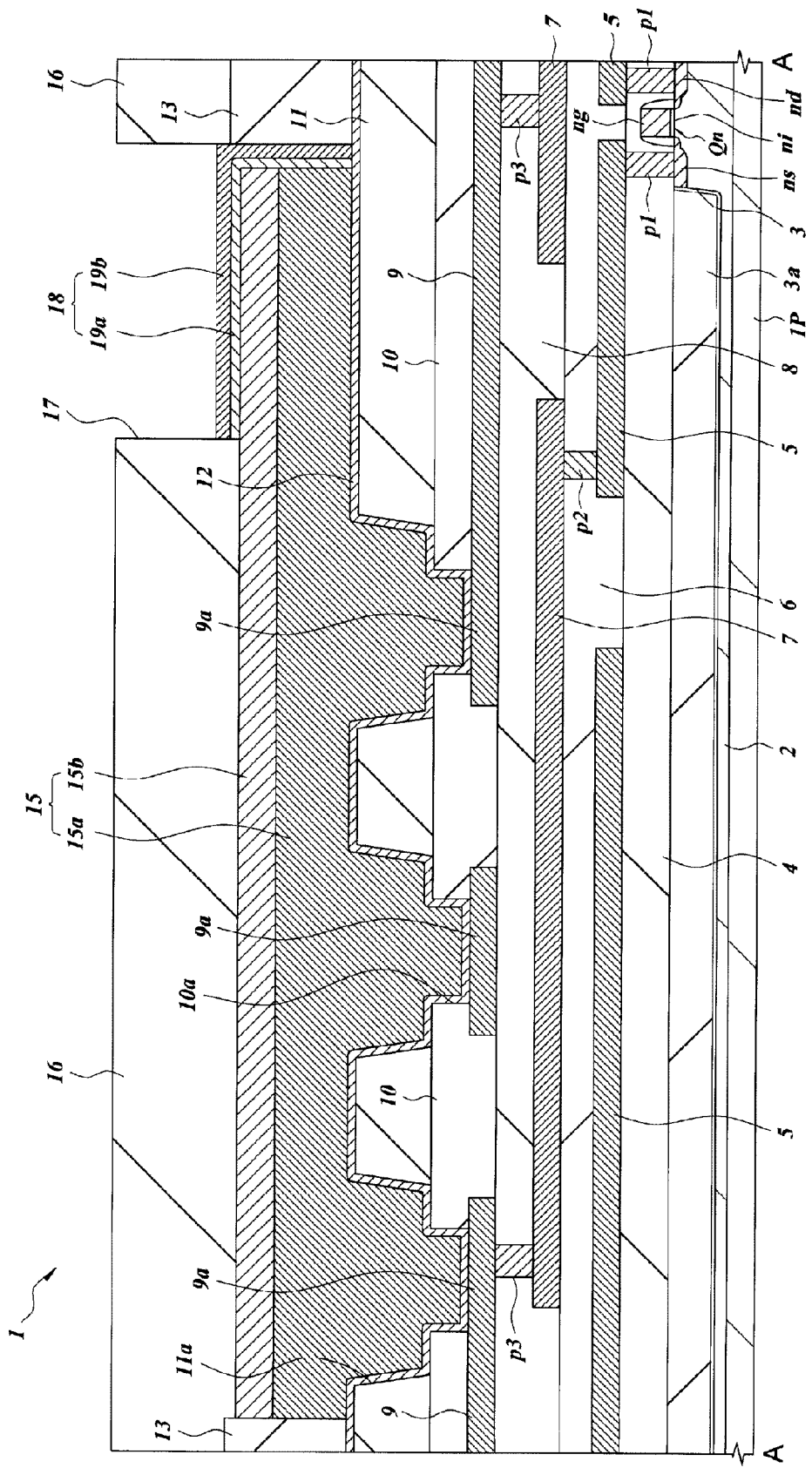
FIG. 15 is a section view showing another example of a method of manufacturing a semiconductor integrated circuit device.
Figure 16:
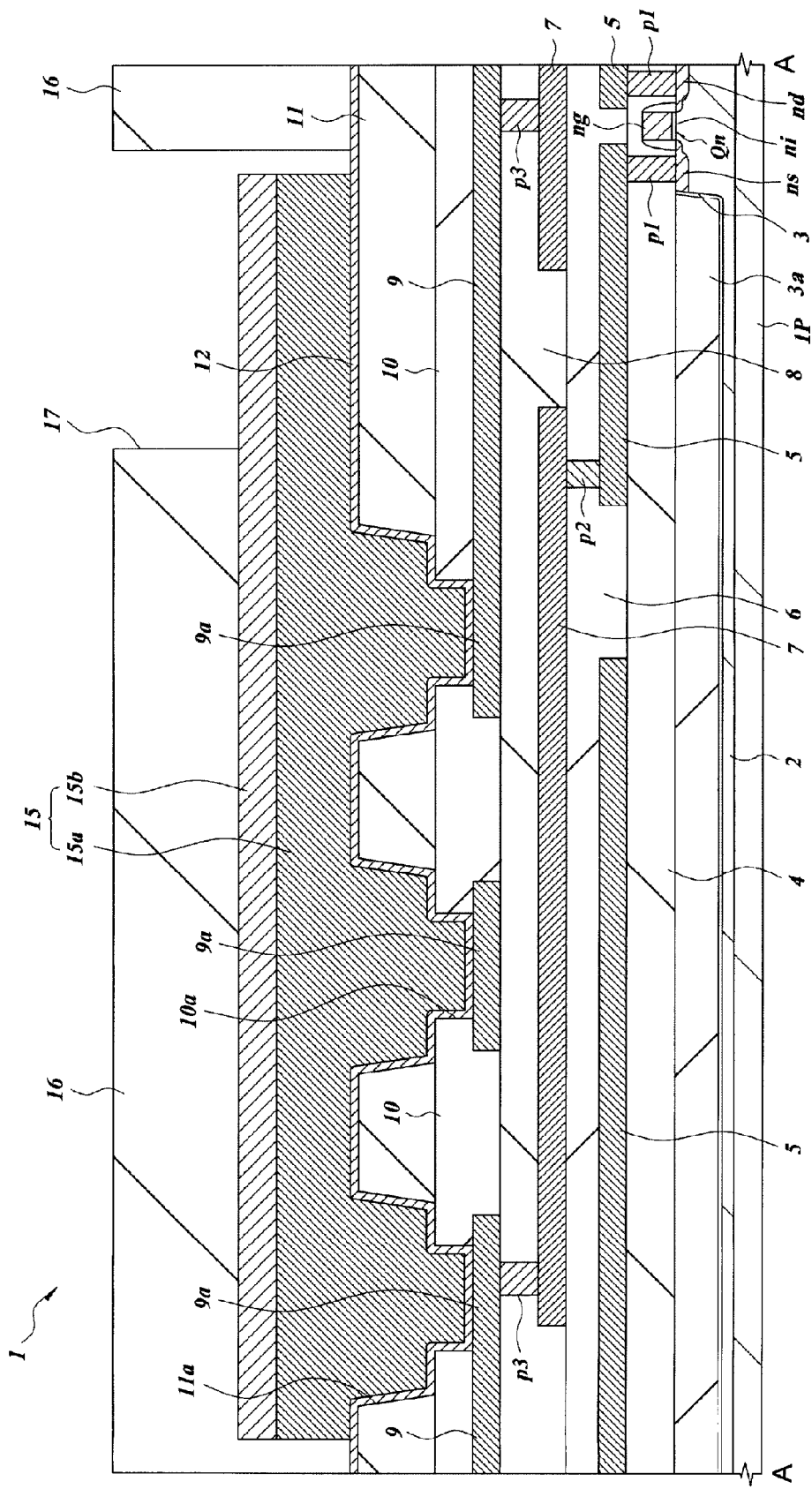
FIG. 16 is a section view showing another example of a method of manufacturing a semiconductor integrated circuit device.
Figure 20:
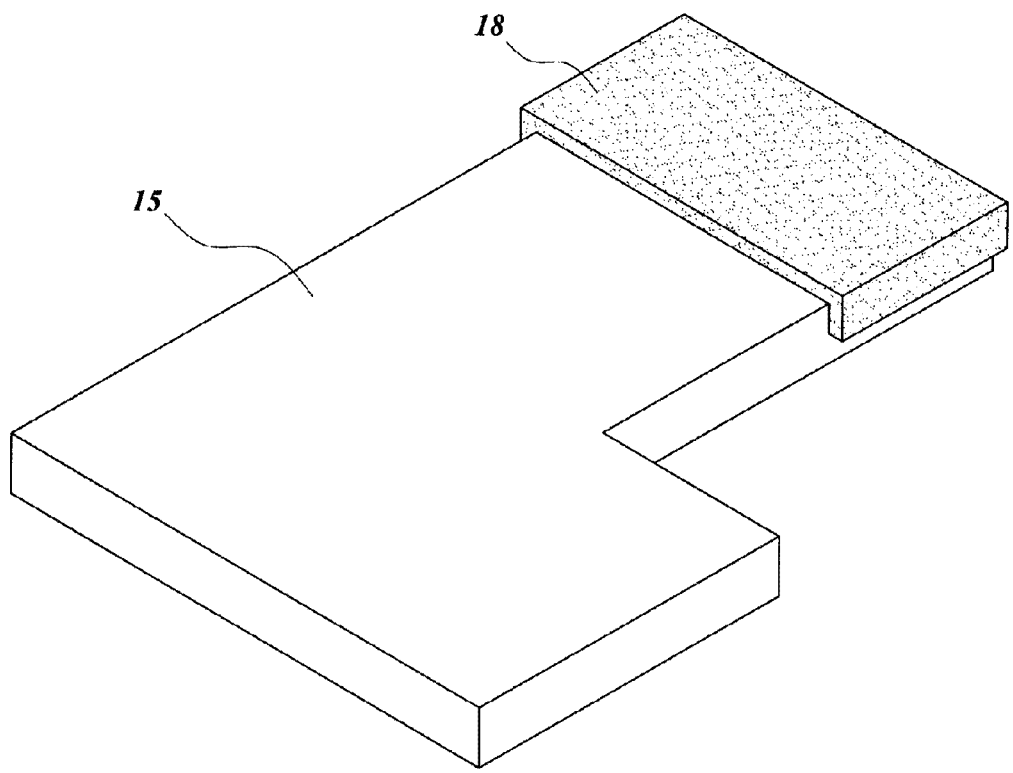
FIG. 20 is a perspective view of a rewiring in which a pad is formed.
Figure 29:
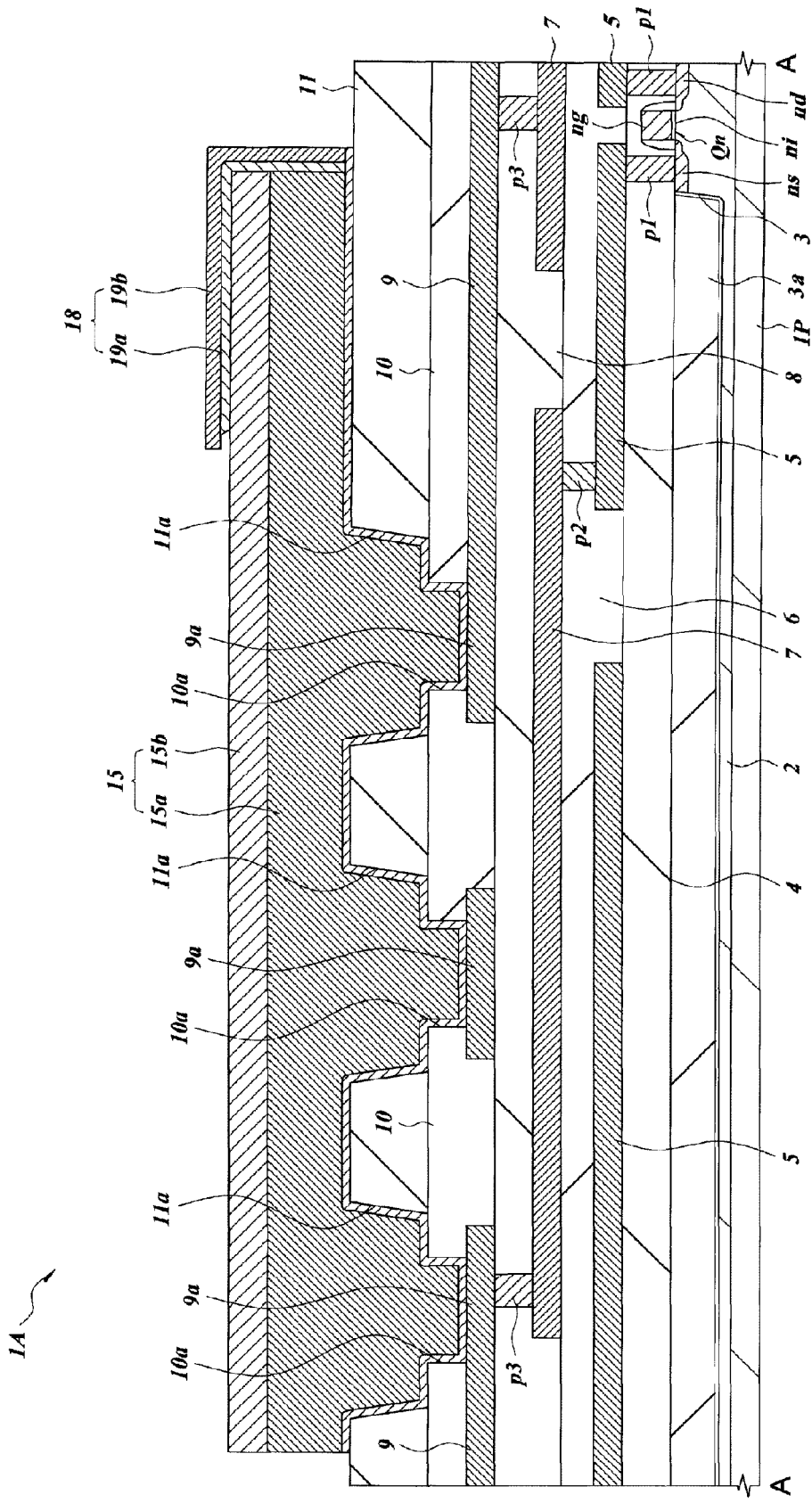
FIG. 29 is a section view showing another example of a section along A-A line in FIG. 3.
Figure 30:
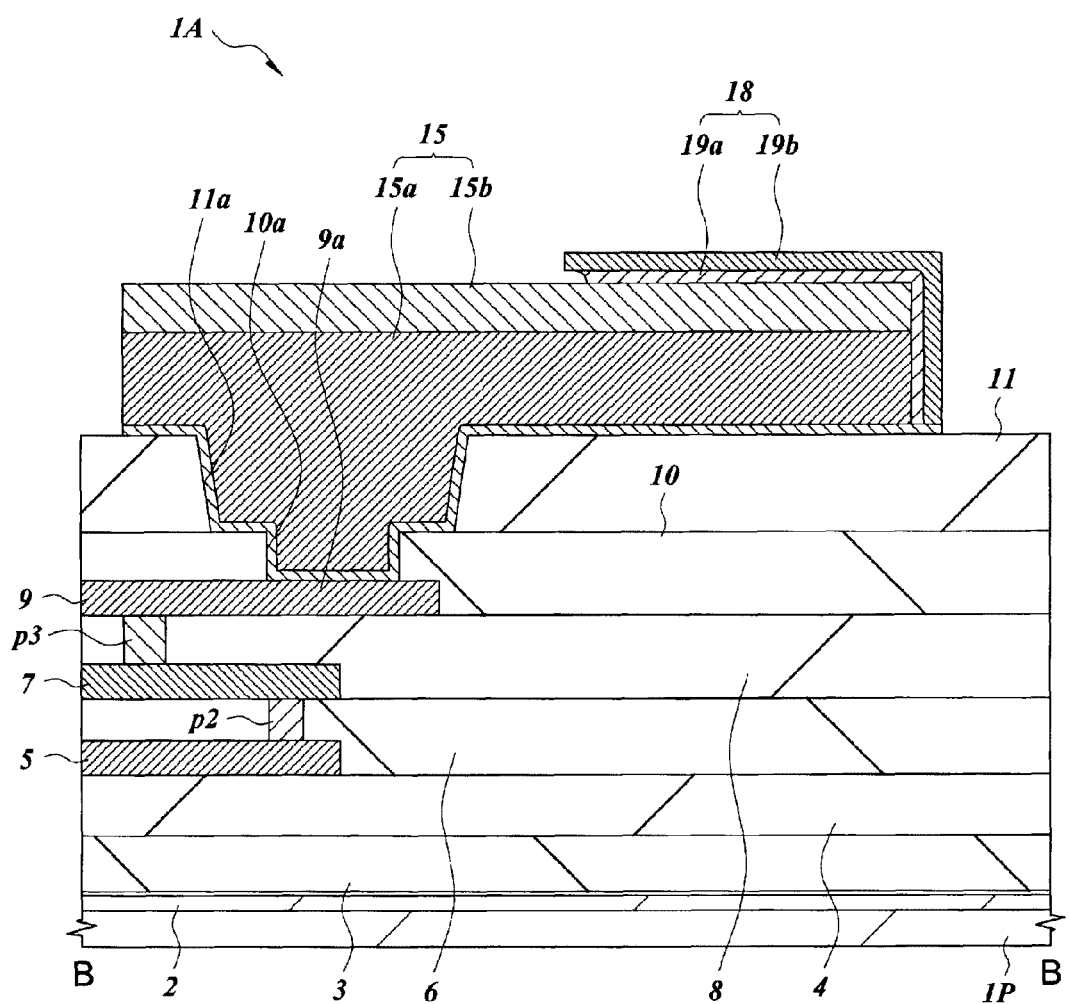
FIG. 30 is a section view showing another example of a section along B-B line in FIG. 5.
Figure 31:
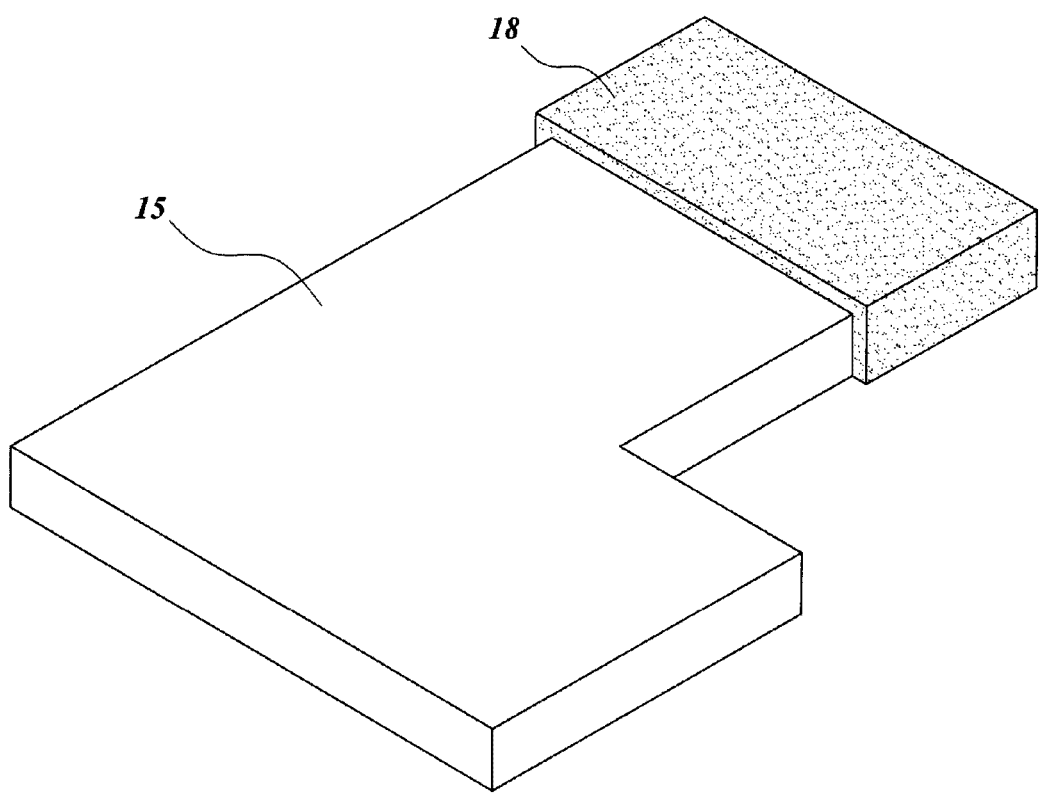
FIG. 31 is a perspective view showing another example of a rewiring in which a pad is formed.
Figure 32:
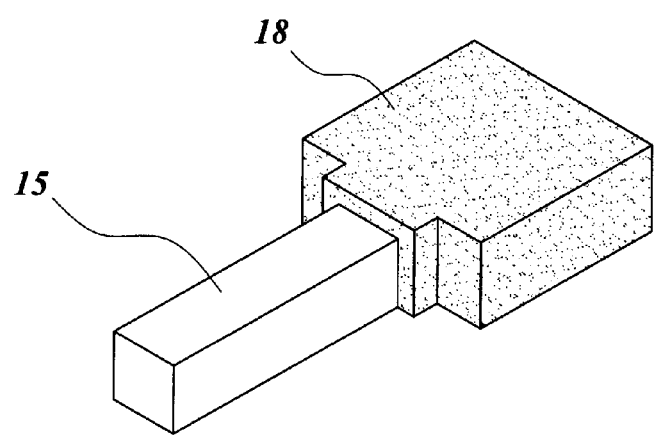
FIG. 32 is a perspective view showing another example of a rewiring in which a pad is formed.

Depending on the film thickness of the photoresist film patterns 13, 16, there is a case where the photoresist film pattern 13 on the bottom of the opening 17 is sufficiently exposed/developed at the time of the exposure/development of the photoresist film pattern 16. In this case, as shown in FIG. 15, the sidewall of the rewiring 15 is completely exposed and the lower end part of the pad 18 reaches the bottom of the sidewall of the rewiring 15. That is, the sidewall of the rewiring 15 is completely exposed and the lower end part of the pad 18 comes to reach the bottom of the sidewall of the rewiring 15. FIG. 29 is a diagram corresponding to FIG. 4 and FIG. 30 is a diagram corresponding to FIG. 6. Further, FIG. 31 is a diagram corresponding to FIG. 20 and FIG. 32 is a diagram corresponding to FIG. 21, as will be described later.

However, it is desirable to increase the area of adhesion between the pad 18 and the rewiring 15 in order to suppress peeling of the pad 18. Consequently, in this case, it may also be possible to deposit the photoresist film pattern 16 after removing the photoresist film pattern 13 to completely expose the sidewall of the rewiring 15.

As described above, the pad 18 is formed only in the rewiring 15 constituting the external coupling terminal of the semiconductor integrated circuit device and the pad 18 is not formed in the rewiring 15 not constituting the external coupling terminal like the rewirings 15S, 15G shown, for example, in FIG. 2. Consequently, in the step of forming the pad 18, the entire surface of the rewiring 15 not constituting the external coupling terminal is covered with the photoresist film pattern 16.

Further, the pad 18 is formed only in the bonding area of the rewiring 15 constituting the external coupling terminal. For example, if the pad 18 is formed on the entire surface of all the rewirings 15, 15a, 15d, 15S, 15G, the photo mask to form the opening 17 in the photoresist film pattern 16 is no longer necessary and the step is also simplified. However, the adhesion properties of the Au (gold) film 19b with the resin 26 are poorer compared to those of the Ni (nickel) film etc., and therefore, if the Au (gold) film 19b is formed on the entire surface of the rewirings 15, 15a, 15d, 15S, 15G, the reliability of adhesion between the resin 26 and the rewirings 15, 15a, 15d, 15S, 15G will be degraded. Furthermore, if the Au (gold) film 19b is formed on the entire surface of the rewirings 15, 15a, 15d, 15S, 15G, the amount of expensive gold that is used increases.

Figure 17:
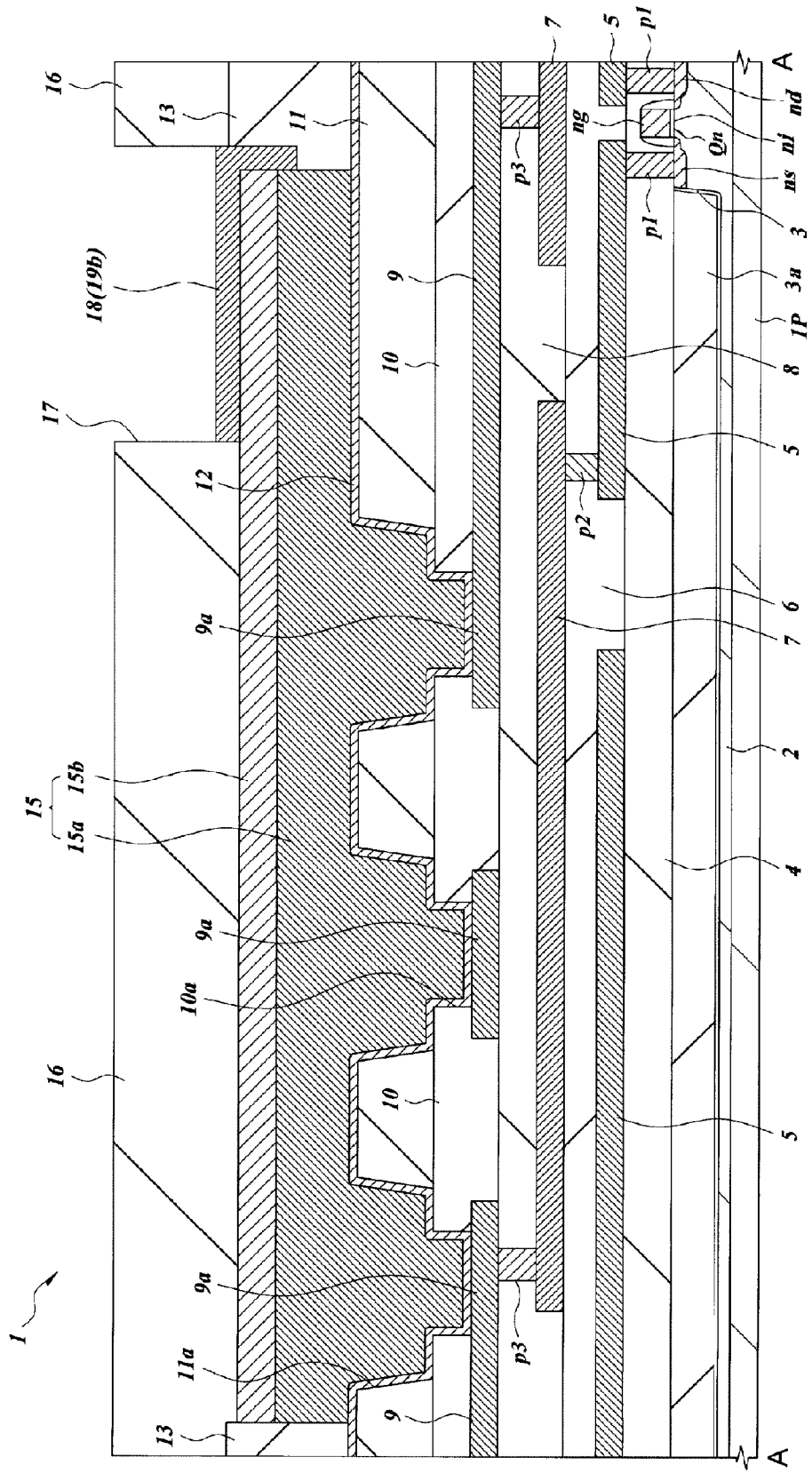
FIG. 17 is a section view showing another example of a method of manufacturing a semiconductor integrated circuit device.

The reason that the pad 18 is caused to include the two-layer film of the Ni (nickel) film 19a and the Au (gold) film 19b is to improve the adhesion properties between the rewiring 15 and the pad 18. That is, when the pad 18 is caused to include only the Au (gold) film 19b, the Cu (copper) film 15a comes into direct contact with the Au (gold) film 19b on the side surface of the rewiring 15 as shown in FIG. 17. However, the mutual adhesion between the Cu (copper) film 15a and the Au (gold) film 19b is weak, and therefore, the pad 18 becomes more likely to peel off from the rewiring 15 on the side surface of the rewiring 15 in this case. Because of this, by causing the Ni (nickel) film 19a having high adhesion with both the Cu (copper) film 15a and the Au (gold) film 19b to intervene in between, it is possible to suppress the peeling of the pad 18 on the side surface of the rewiring 15.

Figure 18:
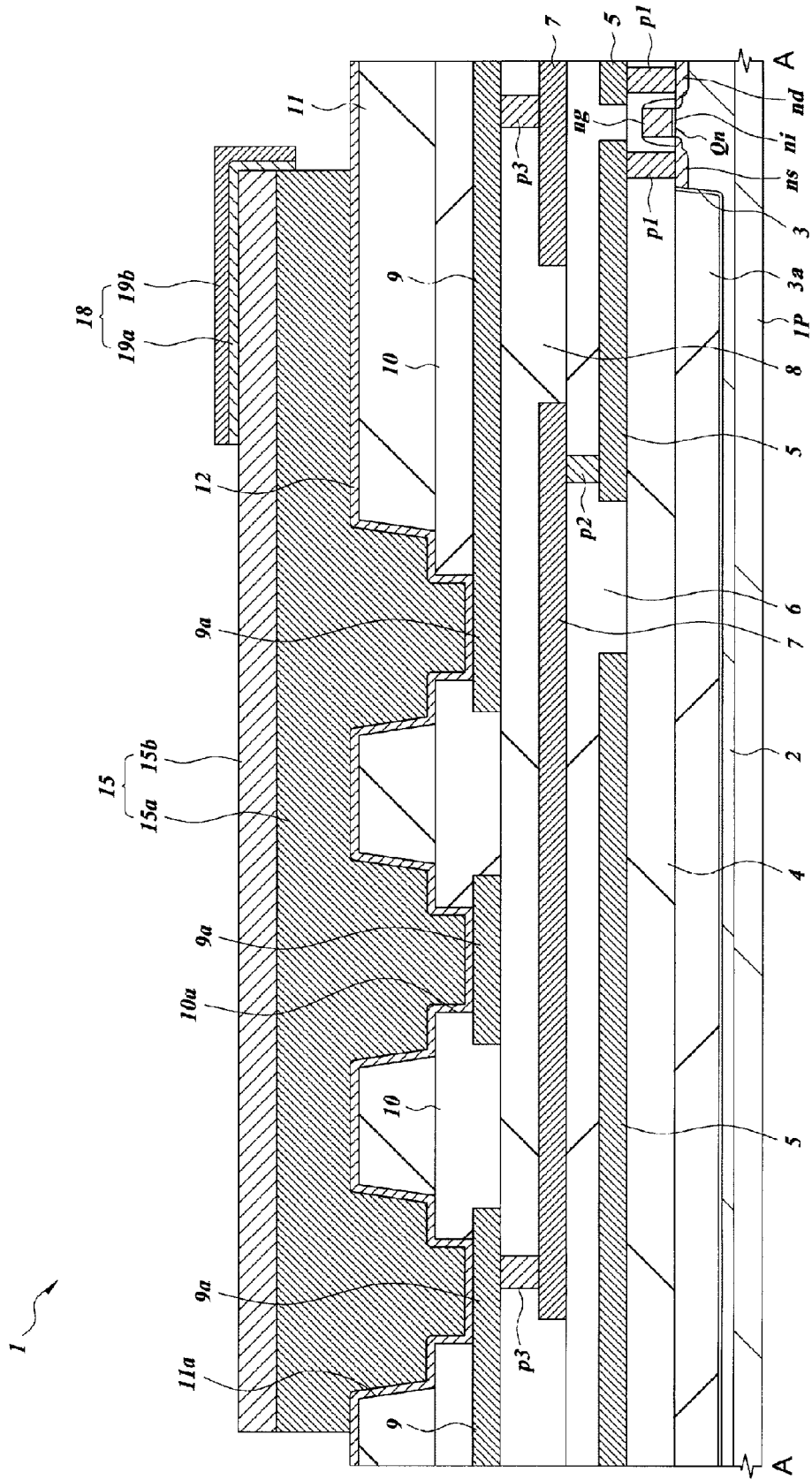
FIG. 18 is a section view showing a method of manufacturing a semiconductor integrated circuit device, following FIG. 14.

Next, as shown in FIG. 18, the photoresist film patterns 13, 16 of the two-layer film that is no longer necessary are removed by a remove agent or ashing. That is, the first and second photoresist film patterns 13, 16 are removed.

Figure 19:
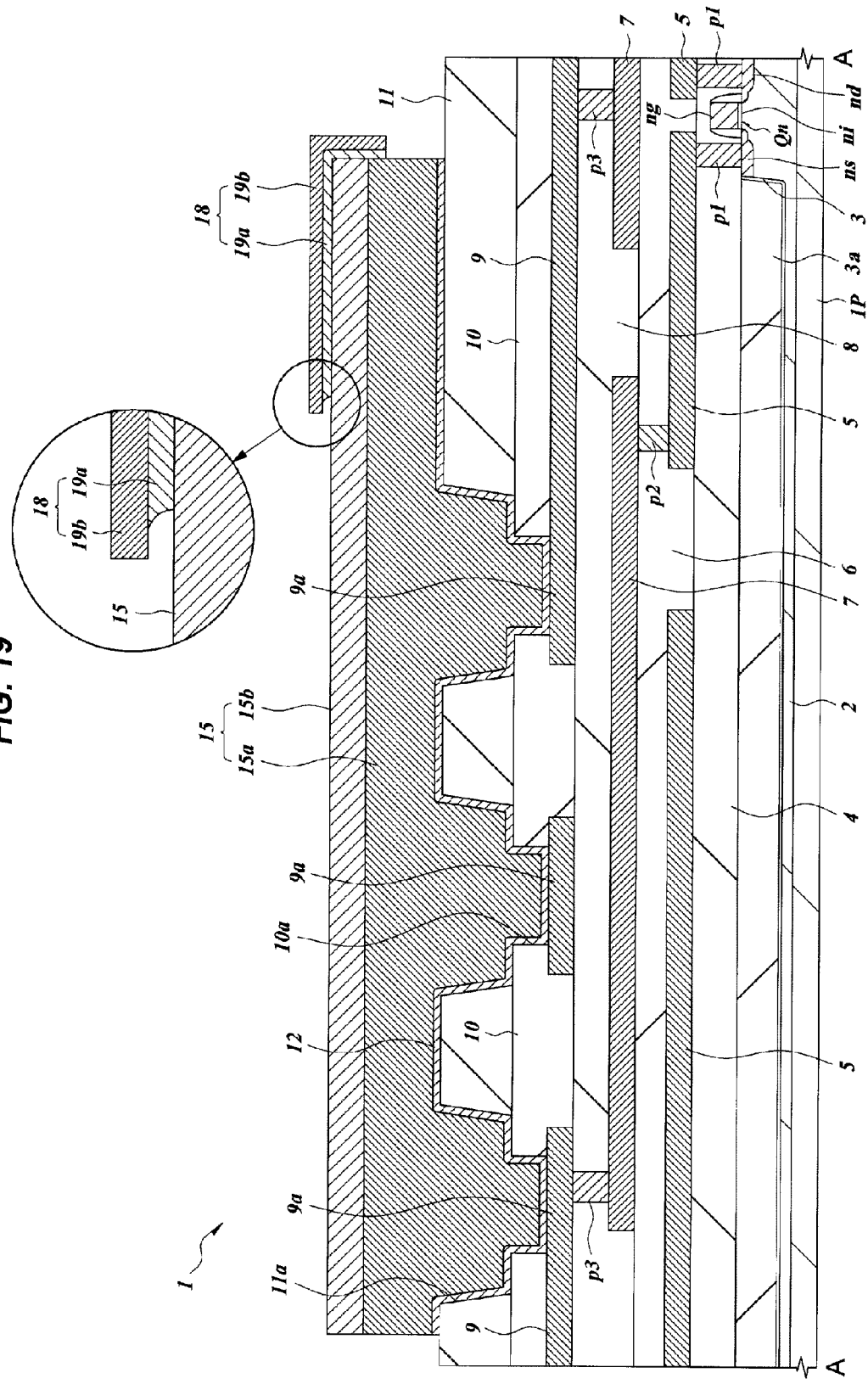
FIG. 19 is a section view showing a method of manufacturing a semiconductor integrated circuit device, following FIG. 18.

Next, as shown in FIG. 19, the unnecessary seed film 12 (two-layer film of the barrier metal film and the Cu (copper) film) exposed in the region where the photoresist film pattern 13 is removed by wet etching. That is, the seed film 12 in the region covered with the first photoresist film pattern 13 is removed. Here, the removal of the Cu (copper) film uses, for example, wet etching processing with a hydrogen peroxide solution at about 25° C. for about 7 to 13 seconds. Further, the removal of the barrier metal film (Cr (chromium) film) uses wet etching processing with a mixture solution of potassium permanganate and sodium metasilicate etc. at about 25° C. for about 17 to 23 minutes.

When the wet etching processing is performed, on the surface of the rewiring 15, the Ni (nickel) film 19a constituting part of the pad 18 is side-etched by the galvanic action and the area of contact between the rewiring 15 and the Ni (nickel) film 19a is reduced accordingly.

By the steps so far, the rewiring 15 and the pad 18 are completed and the steps (wafer process) to manufacture a semiconductor integrated circuit device is completed.

Figure 21:
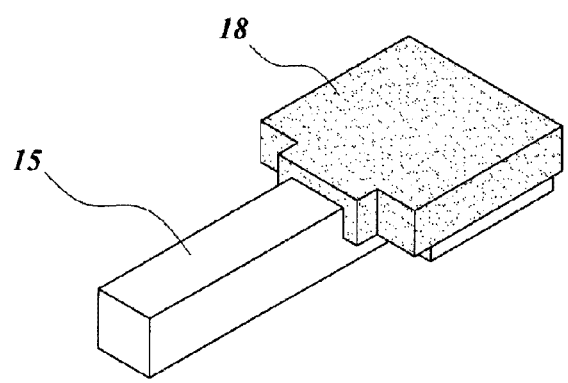
FIG. 21 is a perspective view of a rewiring in which a pad is formed.

FIG. 20 is a perspective view showing the rewiring 15 with a large area (for example, the rewiring 15d) and the pad 18 formed in its bonding area and FIG. 21 is a perspective view showing the rewiring 15 with a small area and the pad 18 formed in its bonding area. When the sidewall of the rewiring 15 is completely exposed (see FIG. 15), FIG. 20 is configured as shown in FIG. 31 and FIG. 21 is configured as shown in FIG. 32.

Next, in order to thin the semiconductor wafer 1, its back surface is ground. The purpose of thinning the semiconductor wafer 1 is to thin the IC package that seals the semiconductor chip 1A obtained from the semiconductor wafer 1. In order to thin the semiconductor wafer 1, the semiconductor wafer 1 is attached to a scriber, not shown schematically, and its back surface is ground by a grinder 22 as shown in FIG. 22. At this time, a back grind tape (protection tape) 23 is pasted to the device surface of the semiconductor wafer 1 to prevent the device surface from being stained or damaged. By the grinding of the back surface, the thickness of the semiconductor wafer 1 becomes about 150 µm to 400 µm. That is, this step is a step of thinning the semiconductor wafer 1 by grinding the back surface of the semiconductor wafer 1 after pasting the back grind tape 23 over the device surface of the semiconductor wafer 1. The technique of grinding the back surface of the semiconductor wafer 1 is adopted in the semiconductor integrated circuit device in which a wire bonding or solder ball is coupled.

Figure 22:
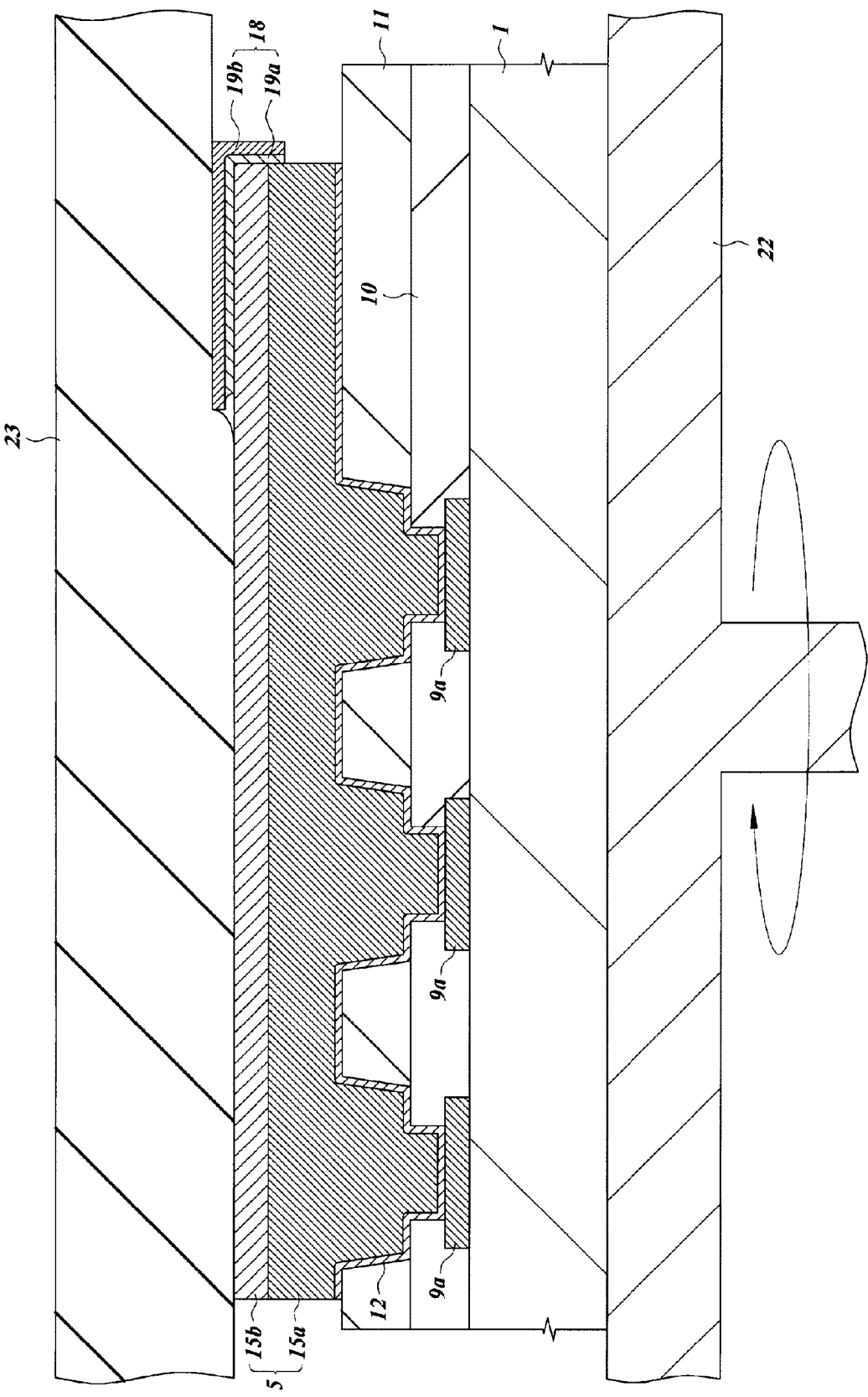
FIG. 22 is a section view showing a method manufacturing a semiconductor integrated circuit device, following FIG. 19.

As shown in FIG. 22, when the back grind tape 23 is pasted to the device surface of the semiconductor wafer 1, part thereof is also pasted to the top surface of the rewiring 15 and the top surface of the pad 18. Because of this, when the adhesion between the rewiring 15 and the pad 18 is low, when the back grind tape 23 is peeled off from the device surface of the semiconductor wafer 1 after the back surface grinding is completed, there is a possibility that the pad 18 is peeled off from the surface of the rewiring 15. Then, the pad 18 that is peeled off will cause trouble of wire bonding, to be described later, such as that it bends and overlaps on the part not peeled off.

As described above, according to the manufacturing method of the present invention, after the rewiring 15 is formed, in the step (see FIG. 19) of removing the seed film 12 that is no longer necessary, the Ni (nickel) film 19a constituting part of the pad 18 is side-etched and the adhesion between the rewiring 15 and the pad 18 is reduced. However, in the present embodiment, the pad 18 is formed not only on the top surface but also on the side surface of the rewiring 15, and therefore, the area of contact between the rewiring 15 and the pad 18 increases and the adhesion is increased accordingly. Due to this, such trouble that the pad 18 is peeled off from the surface of the rewiring 15 when the back grind tape 23 is peeled off from the device surface of the semiconductor wafer 1 is suppressed.

As shown in FIG. 5, FIG. 28, and FIG. 6, the pad 18 is formed in the plan pattern part in the shape of substantially a rectangle and in the part 18z of the wire extending to the pad (Al pad) 9a so as to cover part of the respective side surfaces. The width of the planar pattern part is configured so as to be greater than the width (15w) of the wiring part extending to the pad (Al pad) 9a. The pad 18 is formed in part of the side surface of the two sides 18x, 18x in opposition to each other and in part of the side surface of the two sides 18y, 18y in opposition to each other in the direction perpendicular to that of the two sides 18x, 18x. The pad 18 is formed in part of the side surface of the wire extending to the pad (Al pad) 9a. Due to this, the area of contact between the rewiring 15 and the pad 18 increases, and therefore, it is possible to prevent the pad 18 from being peeled off from the surface of the rewiring 15 when peeling off the back grind tape 23 from the device surface of the semiconductor wafer 1.

Further, as shown in FIG. 3 and FIG. 4, the pad 18 formed, for example, in the rewiring 15d for power source supply has an area larger than that of the pad 18 formed in the rewiring 15 for signal input/output. Consequently, even if the pad 18d is provided in part of the side surface of three or less sides (18x, 18x, 18y), the area of contact between the rewiring 15 and the pad 18 increases, and therefore, it is possible to prevent the pad 18d from being peeled off from the surface of the rewiring 15 when peeling off the back grind tape 23 from the device surface of the semiconductor wafer 1.

Next, the semiconductor wafer 1 is diced. That is, after removing the back grind tape 23 from over the device surface of the semiconductor wafer 1, by dividing the semiconductor wafer 1 into individual chips, the semiconductor chip 1A shown in FIG. 2 to FIG. 6 is obtained.

Figure 23:
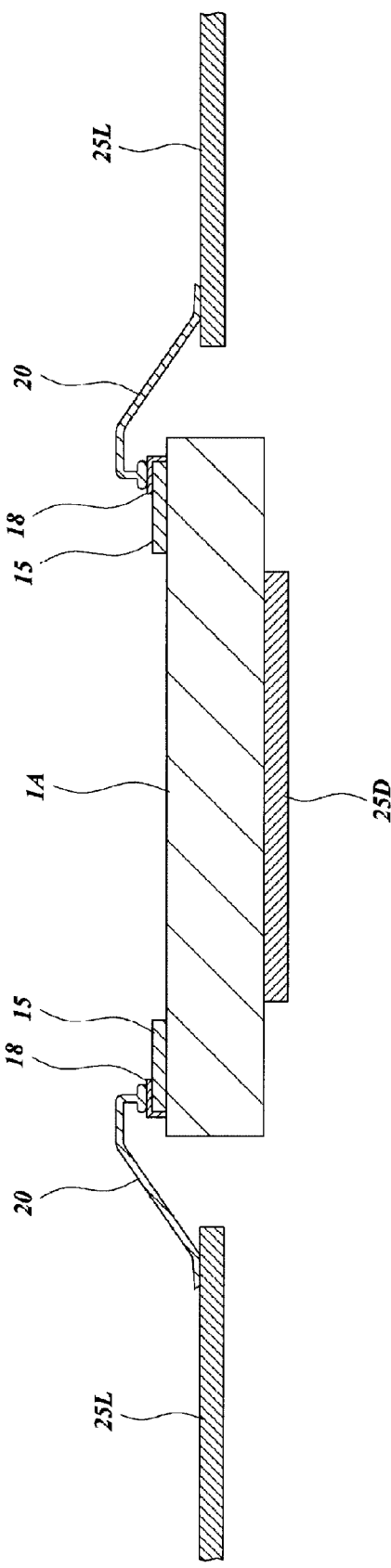
FIG. 23 is a section view showing a method of manufacturing a semiconductor integrated circuit device, following FIG. 22.

Next, as shown in FIG. 23, the semiconductor chip 1A is mounted over a die pad part (mount base) 25D of a lead frame and a lead 25L of the lead frame and the pad 18 of the semiconductor chip 1A are electrically coupled by the wire 20. That is, after fixing the back surface of the semiconductor chip 1A over the die pad part 25D of the lead frame, the pad 18 of the semiconductor chip 1A and the lead 25 are electrically coupled by the wire 20.

Figure 25:
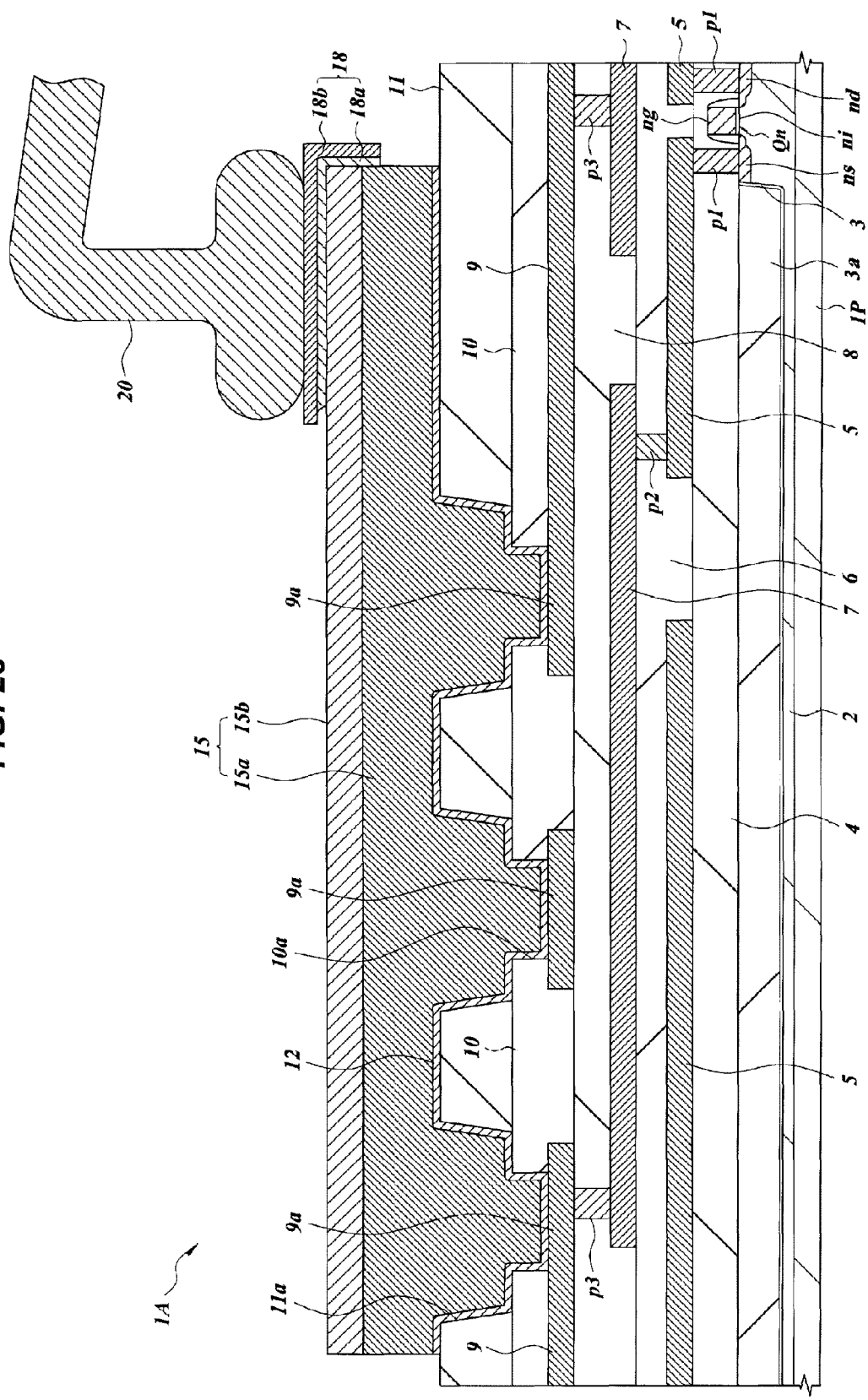
FIG. 25 is an enlarged section view of the vicinity of a rewiring to which a wire is coupled.

FIG. 24 is a plan view showing the device surface of the semiconductor chip 1A to which the wire 20 is coupled and FIG. 25 is an enlarged section view of the vicinity of the rewiring 15. The wire 20 includes, for example, a Cu (copper) alloy or Au (gold) and is coupled to the lead 25L and the pad 18 by, for example, the ball bonding method that uses both heat and ultrasonic waves.

As shown in FIG. 3, FIG. 4, FIG. 24, for example, the rewiring 15d for power source supply is formed extending from the periphery of the semiconductor chip 1A in the direction toward the interior of the semiconductor chip 1A and electrically coupled to the semiconductor element or the semiconductor integrated circuit via the pads (Al pads) 9a. Further, the number of the third layer Al wires 9 or the pads (Al pads) 9a electrically coupled to the pad 18d via the openings 10a is configured so as to be larger than the number of the wires (external coupling terminals) 20 electrically coupled to the pad 18d.

The number of the third layer Al wirings 9 electrically coupled to the rewiring 15d is configured so as to be larger than the number of the wires (external coupling terminals) 20 electrically coupled to the rewiring 15d. Further, the number of the openings 10a formed in the third layer Al wirings 9, respectively, is configured so as to be larger than the number of the wires (external coupling terminals) 20 electrically coupled to the rewiring 15d.

The rewiring 15d having a low resistance value is configured so as to have a great wiring width and electrically coupled to the semiconductor element or the semiconductor integrated circuit via the third layer Al wirings 9 or the openings 10a (pads (Al pads) 9a). That is, the third layer Al wiring 9 or the pad (Al pad) 9a exposed from the opening 10a formed in the surface protection film 10 is electrically coupled to the rewiring 15d through the opening 10a and the number of the third layer Al wirings 9 or the pads (Al pads) 9a electrically coupled to the rewiring 15d is configured so as to be larger than the number of the wires (external coupling terminals) electrically coupled to the rewiring 15d. Further, the third layer Al wiring 9 or the pad (Al pad) 9a exposed from the opening 10a formed in the surface protection film 10 is electrically coupled to the rewiring 15d and the number of the openings 10a formed in the third layer Al wiring 9 or the pad (Al pad) 9a is configured so as to be larger than the number of the wires (external coupling terminals) 20 electrically coupled to the rewiring 15d. Furthermore, the rewirings 15a, 15d include the rewiring 15a having a first wiring width and the rewiring 15d having a second wiring width greater than the first wiring width, the rewiring 15d electrically coupled to the external coupling terminal (wire) 20 of the semiconductor integrated circuit device is electrically coupled to the pads (Al pads) 9a or the third layer Al wirings 9 through the openings 10a, and the number of the openings 10a is configured so as to be larger than the number of the external coupling terminals coupled to the rewiring 15d.

Due to this, the number of the wires (external coupling terminals) 20 can be reduced compared to the case where one pad (Al pad) 9a is provided corresponding to one wire. (external coupling terminal) 20 and their pairs are provided in the number corresponding to that of the pads (Al pads) 9a, and therefore, it is possible to increase the degree of freedom in wiring design of the rewiring 15 and the three-layer wiring (first layer Al wiring 5, second layer Al wiring 7, third layer Al wiring 9). Further, by constituting the rewiring 15d for power source supply having a low resistance value so as to have a great wiring width and electrically coupling the rewiring 15d to the semiconductor element or semiconductor integrated circuit via the third layer Al wirings 9 or the openings 10a, the ON resistance can be reduced and the voltage of the power source etc. can be stabilized. Furthermore, it is possible to stably supply power source to the semiconductor element or semiconductor integrated circuit. Still furthermore, it is possible to improve the characteristics of the semiconductor integrated circuit device.

Even if the rewiring 15a has a corresponding wiring width so that a pad 18a is electrically coupled to one wire (external coupling terminal) 20, the rewiring 15a having a low resistance value is provided so as to extend and electrically coupled to the semiconductor element or semiconductor integrated circuit via the two or more openings 10a (pads (Al pad) 9a). Due to this, similarly to the above, the number of the wires (external coupling terminals) 20 can be reduced, and therefore, it is possible to increase the degree of freedom in wiring design of the rewiring 15 and the three-layer wiring (first layer Al wiring 5, second layer Al wiring 7, third layer Al wiring 9). Further, by electrically coupling the rewiring 15 having a low resistance value to the semiconductor element or semiconductor integrated circuit via the openings 10a (pads (Al pads) 9a), the ON resistance can be reduced and the voltage to the power source etc. can be stabilized. Furthermore, it is possible to stably supply a signal/voltage to the semiconductor element or the semiconductor integrated circuit.

Figure 26:
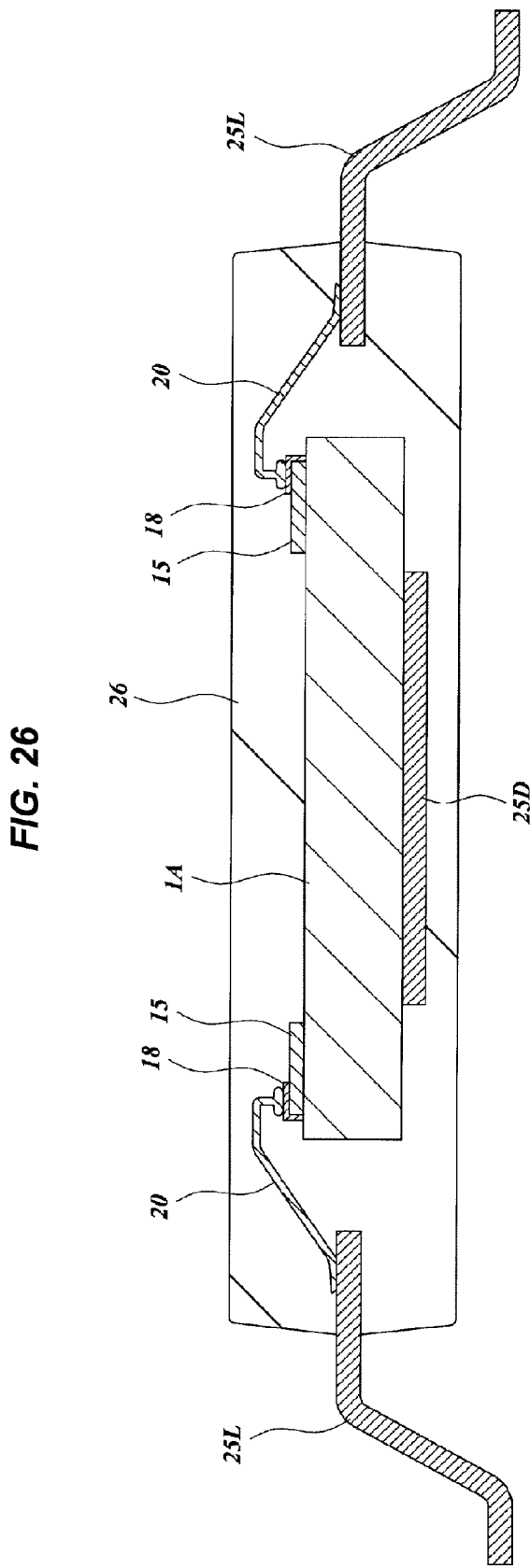
FIG. 26 is a section view showing a method of manufacturing a semiconductor integrated circuit device, following FIG. 23.

After that, as shown in FIG. 26, by sealing part (inner lead) of the lead 25L, the die pad part 25D, the semiconductor chip 1A, and the wire 20 with the resin (sealing resin) 26 such as a thermosetting epoxy resin (packaging step), the semiconductor integrated circuit device (semiconductor device) in the present embodiment is completed. The resin 26 is formed so as to come into contact with the rewiring 15 and the polyimide resin film 11.

As described above, the Au (gold) film 19b constituting the pad 18 has adhesion properties with the resin 26 poorer compared to those of the Ni (nickel) film 15b etc., and therefore, if the Au (gold) film 19b is formed on the entire surface of the rewiring 15, the reliability of adhesion between the resin 26 and the rewiring 15 is reduced.

As shown in FIG. 2, FIG. 16, FIG. 24, and FIG. 26, by selectively providing the pad 18 (Au film 19b) in part of the top surface of the rewiring 15, for example, the region (region for which an alignment margin is considered) coupled to the external coupling terminal of the rewirings 15, 15a, 15d, it is possible to improve the reliability of adhesion between the resin 26 and the rewirings 15, 15a, 15d. That is, by constituting the uppermost surface of the rewirings 15, 15a, 15d by the Ni (nickel) film 15b, it is possible to improve the reliability of adhesion between the resin 26 and the rewirings 15, 15a, 15d, and therefore, to improve the reliability of the semiconductor integrated circuit device.

By not providing the pad 18 (Au film 19b) to the rewirings 15S, 15G not coupled directly to the external coupling terminal, it is possible to improve the reliability of adhesion between the resin 26 and the rewirings 15S, 15G. That is, by constituting the entire surface of the uppermost surface of the rewirings 15S, 15G by the Ni (nickel) film 15b, it is possible to improve the reliability of adhesion between the resin 26 and the rewirings 15S, 15G, and therefore, to improve the reliability of the semiconductor integrated circuit device.

When increasing the degree of freedom in wiring design by using the rewirings 15, 15a, 15d, 15S, 15G as part of the multilayer wiring, the wire density of the rewirings 15, 15a, 15d, 15S, 15G increases, however, by setting a region in which the pad 18 is provided to part (region coupled to the external coupling terminal) of the rewirings 15, 15a, 15d and constituting almost all the region of the uppermost surface of the rewirings 15, 15a, 15d, 15S, 15G by the Ni (nickel) film 15b, it is possible to improve the reliability of adhesion between the resin 26 and the rewirings 15, 15a, 15d, 15S, 15G, and therefore, to improve the reliability of the semiconductor integrated circuit device.

The invention made by the inventors of the present invention are explained specifically as above based on the embodiments, however, it is needless to say that the present invention is not limited to the embodiments and there can be various modifications within the scope not deviating from its gist.

Figure 27:
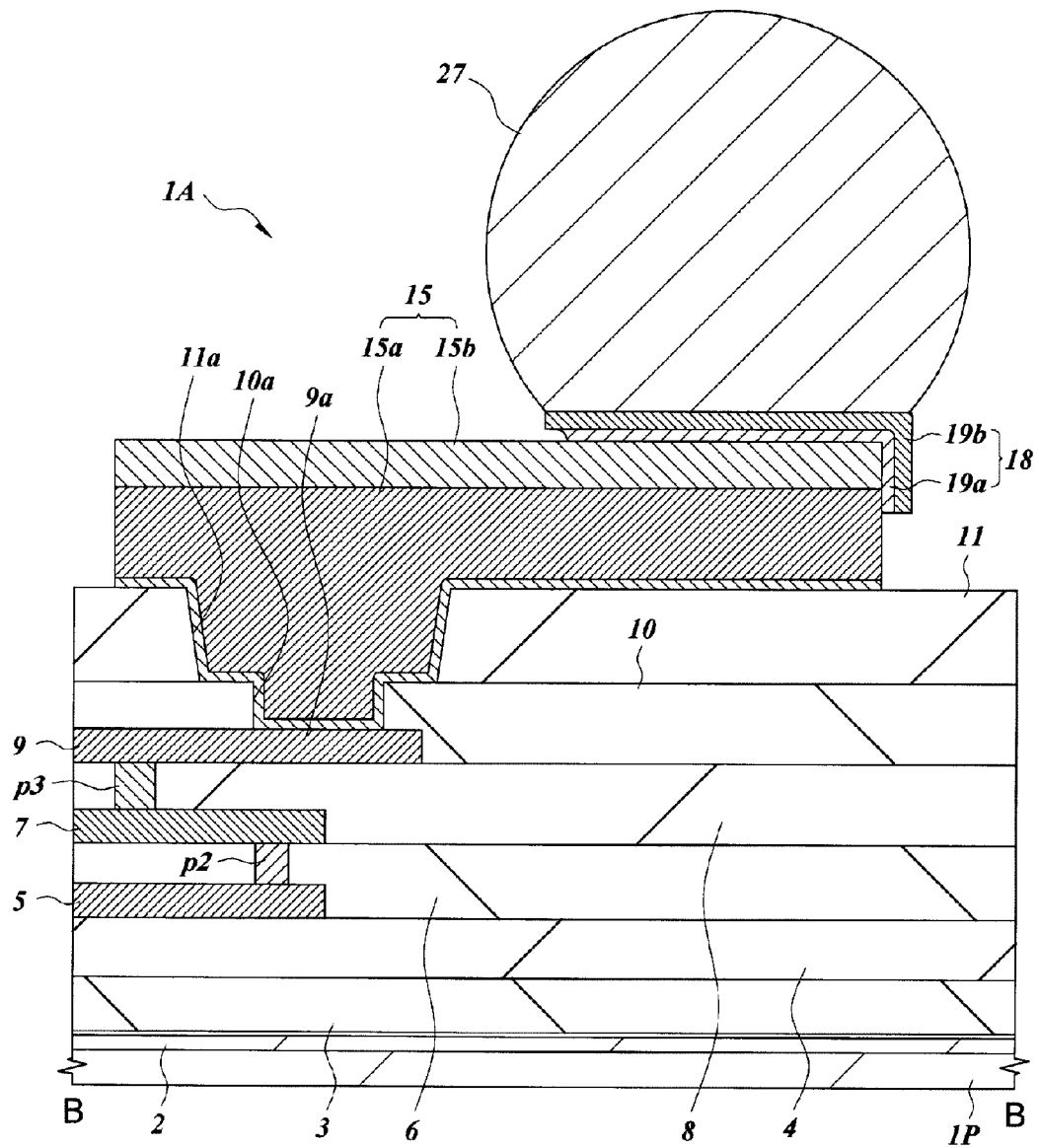
FIG. 27 is a section view showing another example of a semiconductor integrated circuit device of the present invention.
Figure 33:
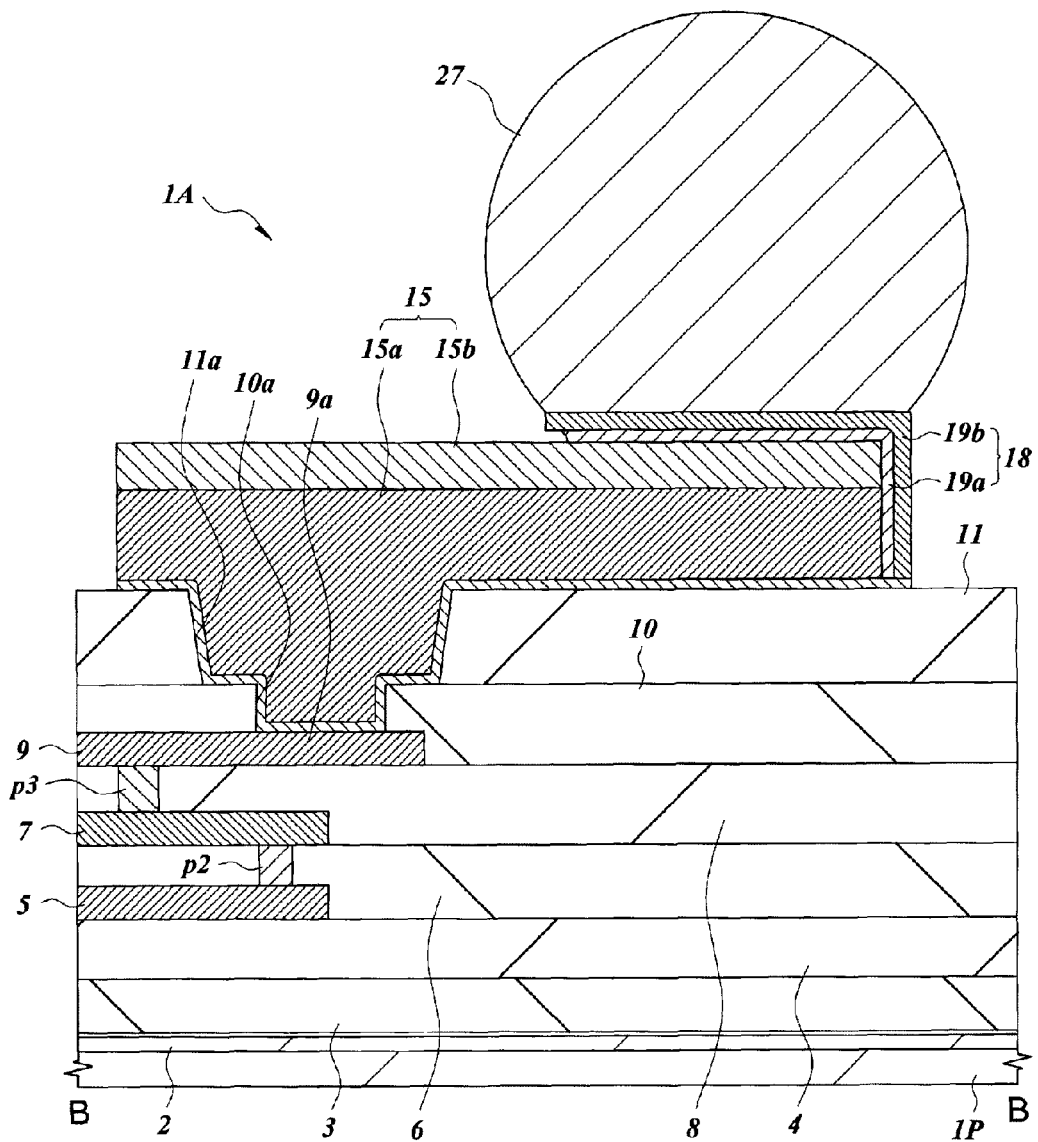
FIG. 33 is a section view showing another example of a semiconductor integrated circuit device of the present invention.

In the embodiments described above, the semiconductor device in which the wire 20 is coupled to the pad 18 of the rewiring 15 is explained, however, as shown, for example, in FIG. 27 and FIG. 33, the present invention can also be applied to a semiconductor integrated circuit device in which a solder ball 27 is coupled to the pad 18 of the rewiring 15. In this case, it is possible to obtain the same effects as those in the embodiments described above by forming a third insulating film, such as a polyimide resin film, over the polyimide resin film (second insulating film) 11, which is an insulating film including the top of the rewiring 15, for example.

The present invention is effective when applied to a semiconductor integrated circuit device (semiconductor device) having a high withstand voltage MIS transistor, however, not limited to this, and is of course also effective when applied to a semiconductor integrated circuit device (semiconductor device) including a low withstand voltage MIS transistor.

The present invention can be applied to a semiconductor integrated circuit device having a rewiring including a metal film on the top of a plurality of wire layers formed over a main surface of a semiconductor substrate.

What is claimed is:

1. A semiconductor integrated circuit device comprising:
   (a) a semiconductor substrate having a device surface;
   (b) a plurality of semiconductor elements formed on the device surface and a plurality of wiring layers coupling the semiconductor elements;
   (c) a protection film covering a top of the device surface;
   (d) a first pad including part of an uppermost wiring layer of the plurality of wiring layers and exposed from a pad opening formed in the protection film;
   (e) a rewiring formed on top of the protection film electrically coupled to the first pad through the pad opening and having a first region and a second region;
   (f) a second pad formed integrally so as to cover at least part of a top surface of the second region of the rewiring and at least part of a side surface of the second region of the rewiring; and
   (g) a metal wire bonded on the second pad,
   wherein the rewiring includes a first copper film and a first nickel film formed on the first copper film,
   wherein the second pad includes a second nickel film and a first gold film formed on the second nickel film,
   wherein the first region of the first nickel film is exposed from the second pad, and
   wherein the rewiring, second pad, and the metal wire are sealed with a resin such that the first region of the first nickel film is connected to the resin.

2. The semiconductor integrated circuit device according to claim 1,
   wherein the metal wire includes a metal containing copper as a main component.

3. The semiconductor integrated circuit device according to claim 1,
   wherein a barrier metal film is formed between the rewiring and the first pad.

4. The semiconductor integrated circuit device according to claim 3, wherein the barrier metal film is formed of a chromium film, a titanium film, a titanium nitride film, or a tungsten nitride film.

* * * * *